United States Patent
Nagumo et al.

(10) Patent No.: US 9,553,131 B2
(45) Date of Patent: Jan. 24, 2017

(54) SEMICONDUCTOR DEVICE AND FORMING METHOD

(71) Applicant: RENESAS ELECTRONICS CORPORATION, Kanagawa (JP)

(72) Inventors: Toshiharu Nagumo, Kanagawa (JP); Kiyoshi Takeuchi, Kanagawa (JP); Toyoji Yamamoto, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/809,106

(22) Filed: Jul. 24, 2015

(65) Prior Publication Data
US 2016/0056207 A1    Feb. 25, 2016

(30) Foreign Application Priority Data

Aug. 19, 2014 (JP) .................................. 2014-166571

(51) Int. Cl.
*H01L 27/24*     (2006.01)
*H01L 45/00*     (2006.01)

(52) U.S. Cl.
CPC ........... *H01L 27/2436* (2013.01); *H01L 45/16* (2013.01)

(58) Field of Classification Search
CPC .............................. H01L 27/2436; H01L 45/16
USPC ............................................................. 257/5
See application file for complete search history.

(56) References Cited

U.S. PATENT DOCUMENTS

| | | | |
|---|---|---|---|
| 6,995,999 B2 | 2/2006 | Morimoto | |
| 8,391,047 B2 | 3/2013 | Maejima et al. | |
| 2013/0094279 A1* | 4/2013 | Kobatake | G11C 13/0007 365/148 |
| 2015/0049538 A1* | 2/2015 | Okubo | G11C 13/0002 365/148 |

FOREIGN PATENT DOCUMENTS

| | | |
|---|---|---|
| JP | 2005-025914 A | 1/2005 |
| JP | 2010-218615 A | 9/2010 |

* cited by examiner

*Primary Examiner* — Fernando L Toledo
*Assistant Examiner* — Adam S Bowen
(74) *Attorney, Agent, or Firm* — McDermott Will & Emery LLP

(57) ABSTRACT

Disclosed is a semiconductor device that reduces the area of a transistor in a ReRAM. A plurality of memory cells differ from each other in the combination of bit line and plate line. The potential of plate line PL2 is a forming voltage. By contrast, the potentials of the other plate lines are +Vi. The potential of bit line BL2 is 0 V (ground potential). By contrast, the potentials of the other bit lines are +Vi. The potential of is +Vgf. By contrast, the potentials of the other word lines are +Vi.

7 Claims, 36 Drawing Sheets

SEMICONDUCTOR DEVICE AND FORMING METHOD

CROSS-REFERENCE TO RELATED APPLICATIONS

The disclosure of Japanese Patent Application No. 2014-166571 filed on Aug. 19, 2014 including the specification, drawings, and abstract is incorporated herein by reference in its entirety.

BACKGROUND

The present invention relates to a semiconductor device and a forming method. More specifically, the present invention relates to a technology that is applicable, for instance, to a resistance random access memory (ReRAM).

The ReRAM is currently developed as a nonvolatile memory. The ReRAM is a memory that uses a variable resistance element. In an initial state, the variable resistance element is an insulator. As described, for instance, in Japanese Unexamined Patent Application Publication No. 2010-218615, the variable resistance element decreases its resistance when subjected to forming. In forming, a high voltage (forming voltage) is applied to the variable resistance element. After forming, the variable resistance element is in either a high-resistance state or a low-resistance state. When a voltage is applied to the variable resistance element, the variable resistance element can switch from the high-resistance state to the low-resistance state or from the low-resistance state to the high-resistance state. The ReRAM retains either "0" or "1" as data depending on whether the variable resistance element is in the high-resistance state or the low-resistance state.

An example of the ReRAM is described in Japanese Unexamined Patent Application Publication No. 2005-25914. This ReRAM includes a plurality of memory cells, a plurality of plate lines, and a plurality of bit lines. Each memory cell includes a transistor and a variable resistance element. The drain of the transistor is coupled to a plate line through the variable resistance element. The source of the transistor is coupled to a bit line. A voltage between the plate line and the bit line causes the variable resistance element in each memory cell to switch from the high-resistance state to the low-resistance state or from the low-resistance state to the high-resistance state.

SUMMARY

As described, for instance, in Japanese Unexamined Patent Application Publication No. 2005-25914, a transistor may be coupled to the variable resistance element. When forming is performed in such an instance, the greater part of a forming voltage may be applied to the transistor. Therefore, the transistor needs to withstand a voltage that is higher than the voltage applied to the transistor in the above instance. Meanwhile, in the above instance, the area of the transistor is large. Other problems and novel features will become apparent from the following description and from the accompanying drawings.

According to an aspect of the present invention, a plurality of memory cells differ from each other in the combination of bit line and plate line. A memory cell is configured so that a transistor breaks down between its drain and source when a voltage between a plate line and a bit line is equal to a forming voltage for a variable resistance element in a situation where the variable resistance element is formed, or configured so that the transistor breaks down between its drain and gate electrode when a voltage between the plate line and a gate electrode is equal to the forming voltage in a situation where the variable resistance element is formed.

According to another aspect of the present invention, a first transistor configures a memory circuit. A second transistor configures a logic circuit. A third transistor configures an I/O cell. The memory circuit includes a plurality of memory cells that differ from each other in the combination of bit line and plate line. The gate length of a first gate electrode of the first transistor is greater than the gate length of a second gate electrode of the second transistor and smaller than the gate length of a third gate electrode of the third transistor. The film thickness of a first gate insulating film of the first transistor is greater than the film thickness of a second gate insulating film of the second transistor and equal to the film thickness of a third gate insulating film of the third transistor.

According to still another aspect of the present invention, a plurality of memory cells differ from each other in the combination of bit line and plate line. When the variable resistance element of a memory cell electrically coupled to a first bit line and to a first plate line is to be formed, a first voltage is given to the first bit line, and a second voltage, which is higher than the first voltage, is given to the first plate line. Further, a third voltage, which is higher than the first voltage and lower than the second voltage, is given to a second bit line.

According to one of the above-described aspects of the present invention, the area of a transistor included in a ReRAM can be reduced.

DETAILED DESCRIPTION

Figure 1:
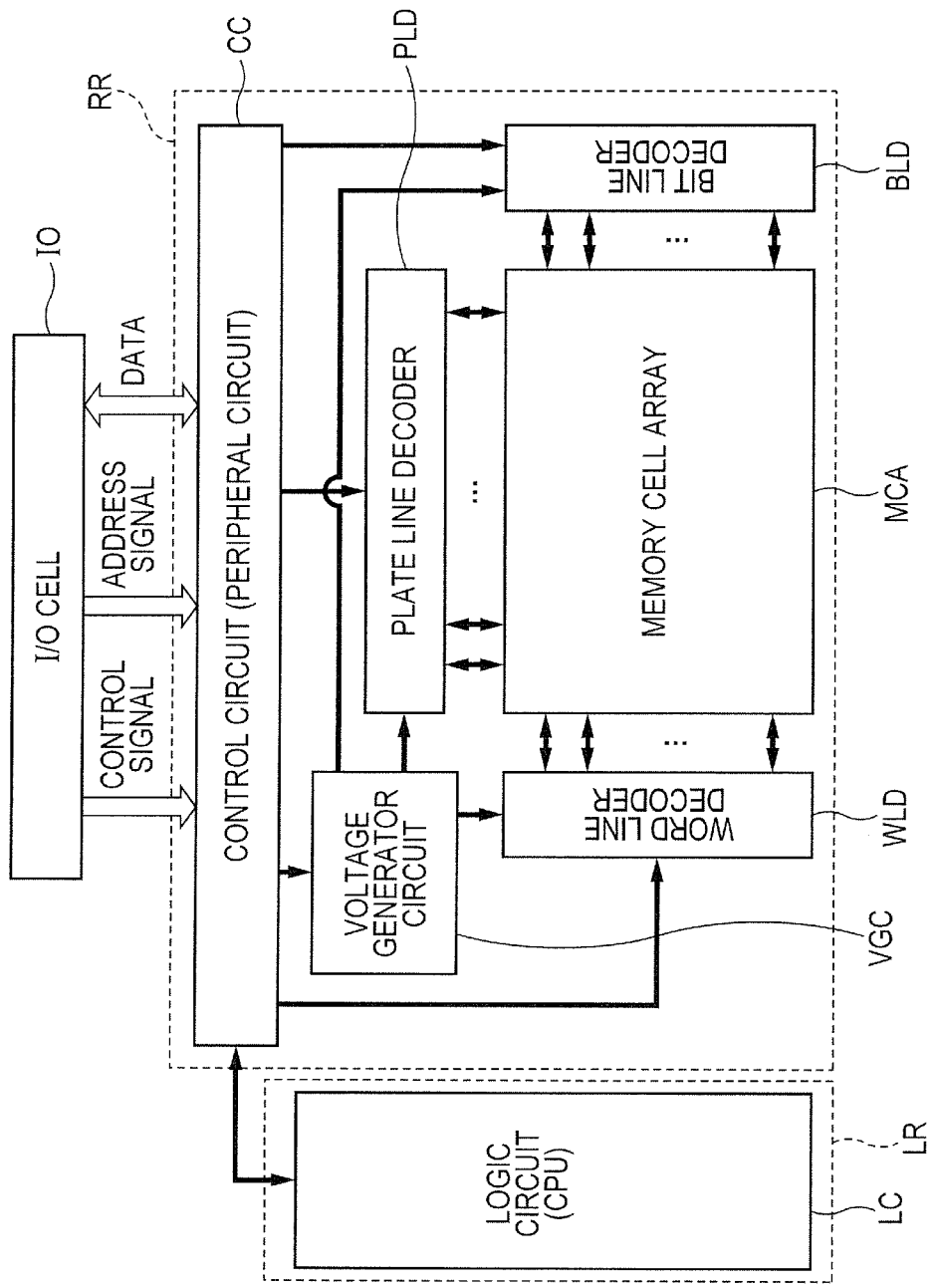
FIG. 1 is a block diagram illustrating a configuration of a semiconductor device according to a first embodiment of the present invention.

Embodiments of the present invention will now be described with reference to the accompanying drawings. Identical elements in the drawings are designated by the same reference numerals and will not be redundantly described.

First Embodiment

FIG. 1 is a block diagram illustrating a configuration of a semiconductor device according to a first embodiment of the present invention. The semiconductor device includes a control circuit CC (peripheral circuit), a voltage generator circuit VGC, a memory cell array MCA, a word line decoder WLD, a plate line decoder PLD, and a bit line decoder BLD in a ReRAM region RR, and includes a logic circuit LC (central processing unit or CPU) in a logic region LR. The semiconductor device further includes an I/O cell IO.

In the example shown in FIG. 1, the control circuit CC is controlled by the logic circuit LC. The control circuit CC inputs a control signal, an address signal, and data from the I/O cell IO. In accordance with the control signal and the address signal, the control circuit CC controls the voltage generator circuit VGC, the word line decoder WLD, the plate line decoder PLD, and the bit line decoder BLD. In the example shown in FIG. 1, when data written in the memory cell array MCA is to be read, the data is forwarded to the control circuit CC. The data is then output from the control circuit CC to the I/O cell IO.

Figure 2:
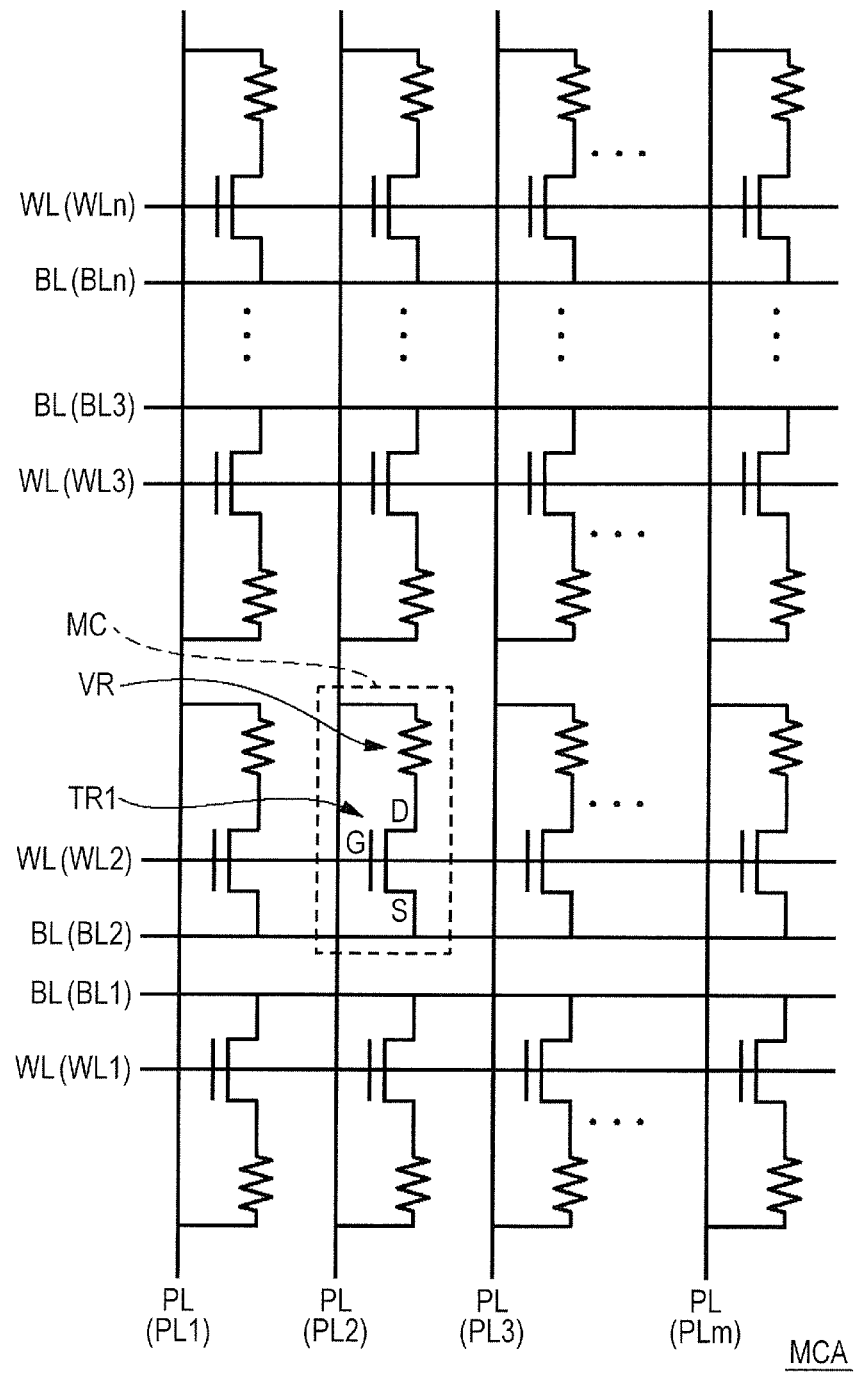
FIG. 2 is a circuit diagram illustrating a configuration of a memory cell array shown in FIG. 1.

As described later with reference to FIG. 2, the memory cell array MCA includes a plurality of word lines WL (FIG. 2), a plurality of bit lines BL (FIG. 2), and a plurality of plate lines PL (FIG. 2). The voltage generator circuit VGC gives a potential to the word lines WL, the bit lines BL, and the plate lines PL in accordance with an operation (forming, read, or write) of the memory cell array MCA. In this instance, the potential of each word line WL is controlled by the word line decoder WLD. The potential of each bit line BL is controlled by the bit line decoder BLD. The potential of each plate line PL is controlled by the plate line decoder PLD. In this manner, each operation of the memory cell array MCA is performed.

FIG. 2 is a circuit diagram illustrating a configuration of the memory cell array MCA shown in FIG. 1. The memory cell array MCA includes the word lines WL, the bit lines BL, the plate lines PL, and a plurality of memory cells MC. Each memory cell MC is electrically coupled to one of the bit lines BL and to one of the plate lines PL. The combination of bit line BL and plate line PL varies from one memory cell MC to another.

More specifically, in the example shown in FIG. 2, the memory cell array MCA includes n (positive integer) bit lines BL (bit lines BL1, BL2, BL3, . . . , BLn) and m (positive integer) plate lines PL (plate lines PL1, PL2, PL3, . . . , PLm). In this instance, n×m different combinations of plate line PL and bit line BL are involved. The memory cells MC are disposed so that they differ from each other in the combination of plate line PL and bit line BL. As a result, the memory cell array MCA includes n×m memory cells MC.

In the example shown in FIG. 2, the memory cell array MCA further includes n word lines WL (word lines WL1, WL2, WL3, . . . , WLn). The number of word lines WL is the same as the number of bit lines BL. Each word line WL is provided for the memory cells MC that are coupled to the same bit line BL. In this instance, the word lines WL are electrically coupled to the gate electrode (G) of a transistor TR1.

Each memory cell includes a variable resistance element VR and the transistor T1. The variable resistance element is electrically coupled to a plate line PL. The transistor TR1 is electrically coupled at its source (S) to a bit line BL and electrically coupled at its drain (D) to a plate line PL through the variable resistance element VR.

Figure 3:
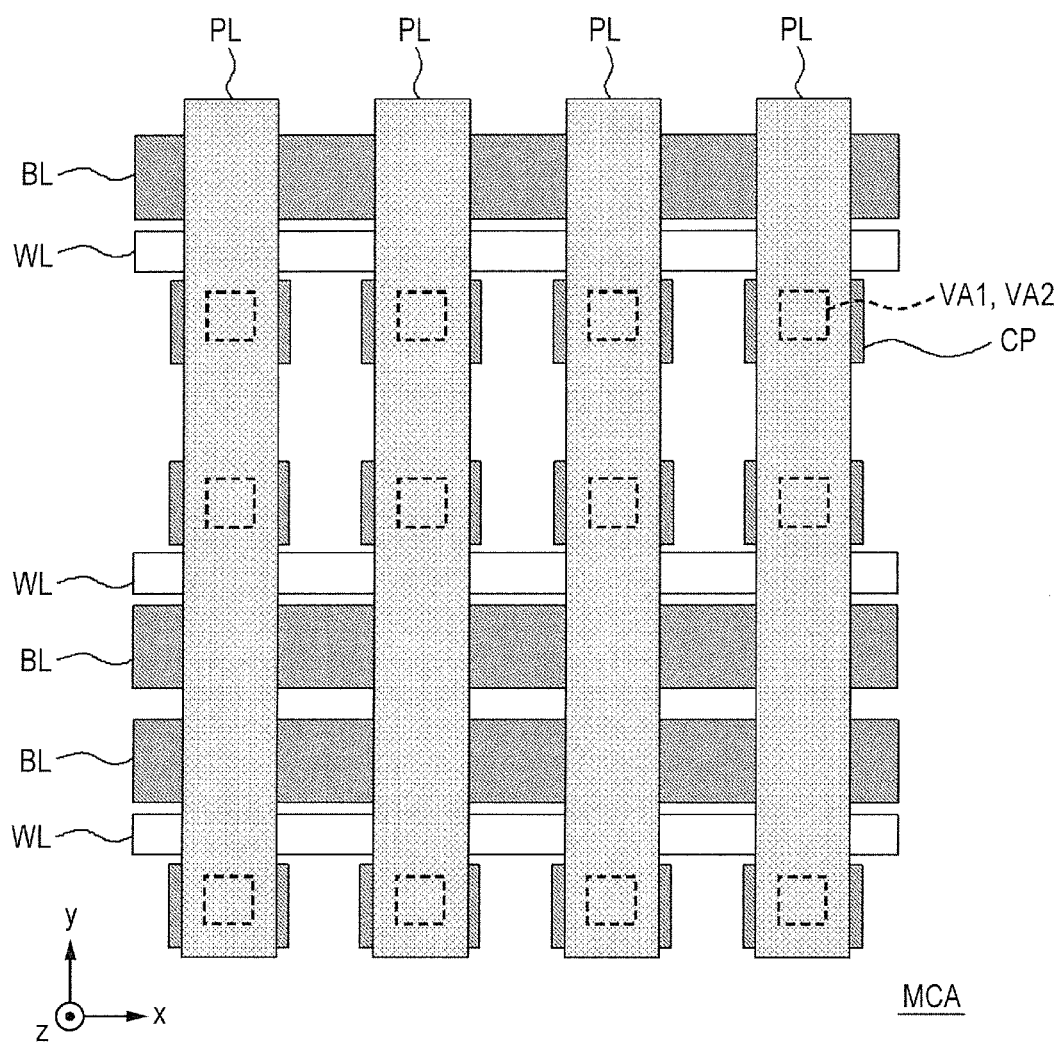
FIG. 3 is a plan view illustrating an exemplary configuration of the memory cell array shown in FIG. 2.
Figure 4:
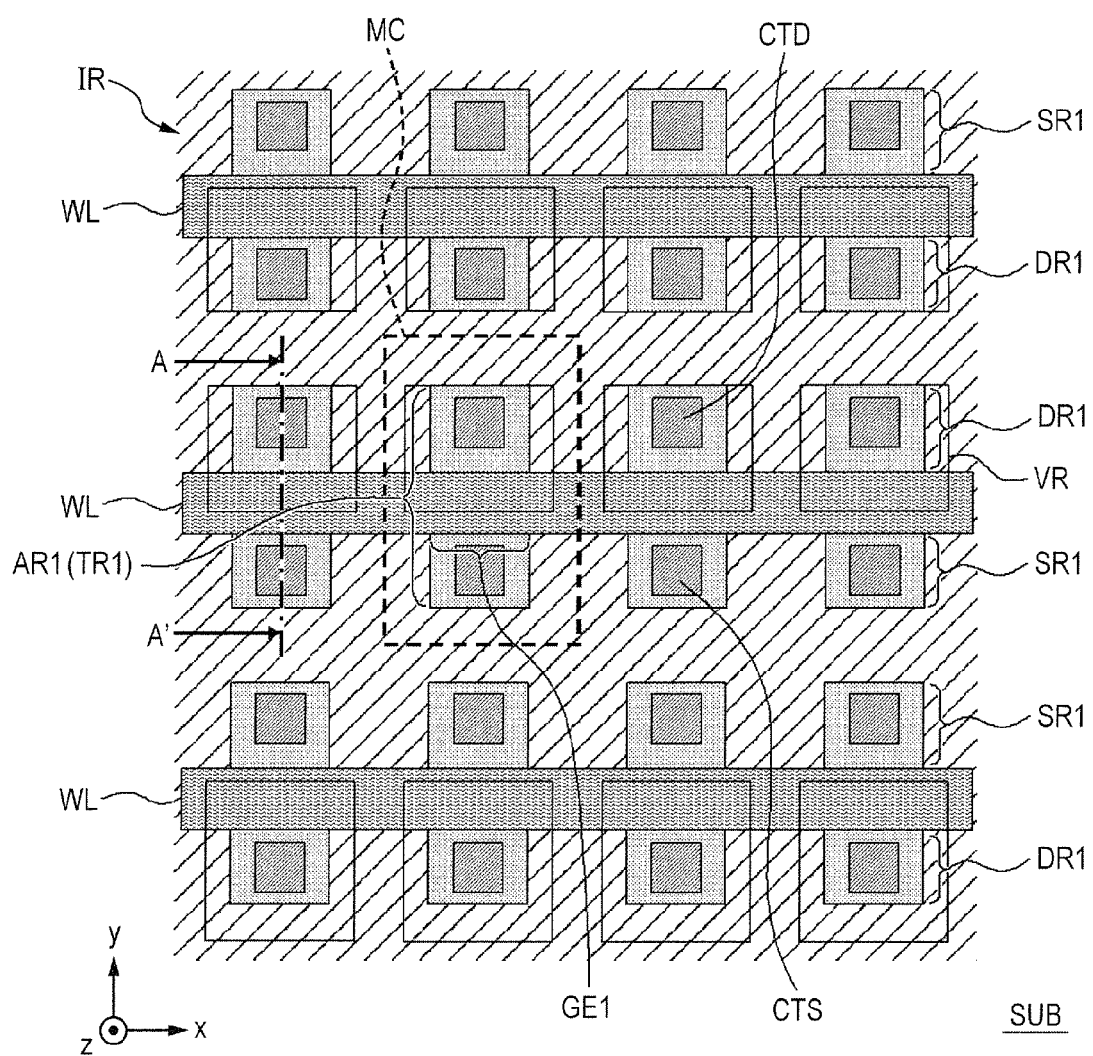
FIG. 4 is a diagram obtained when bit lines, plate lines, conductor patterns, and vias are removed from FIG. 3.
Figure 5:
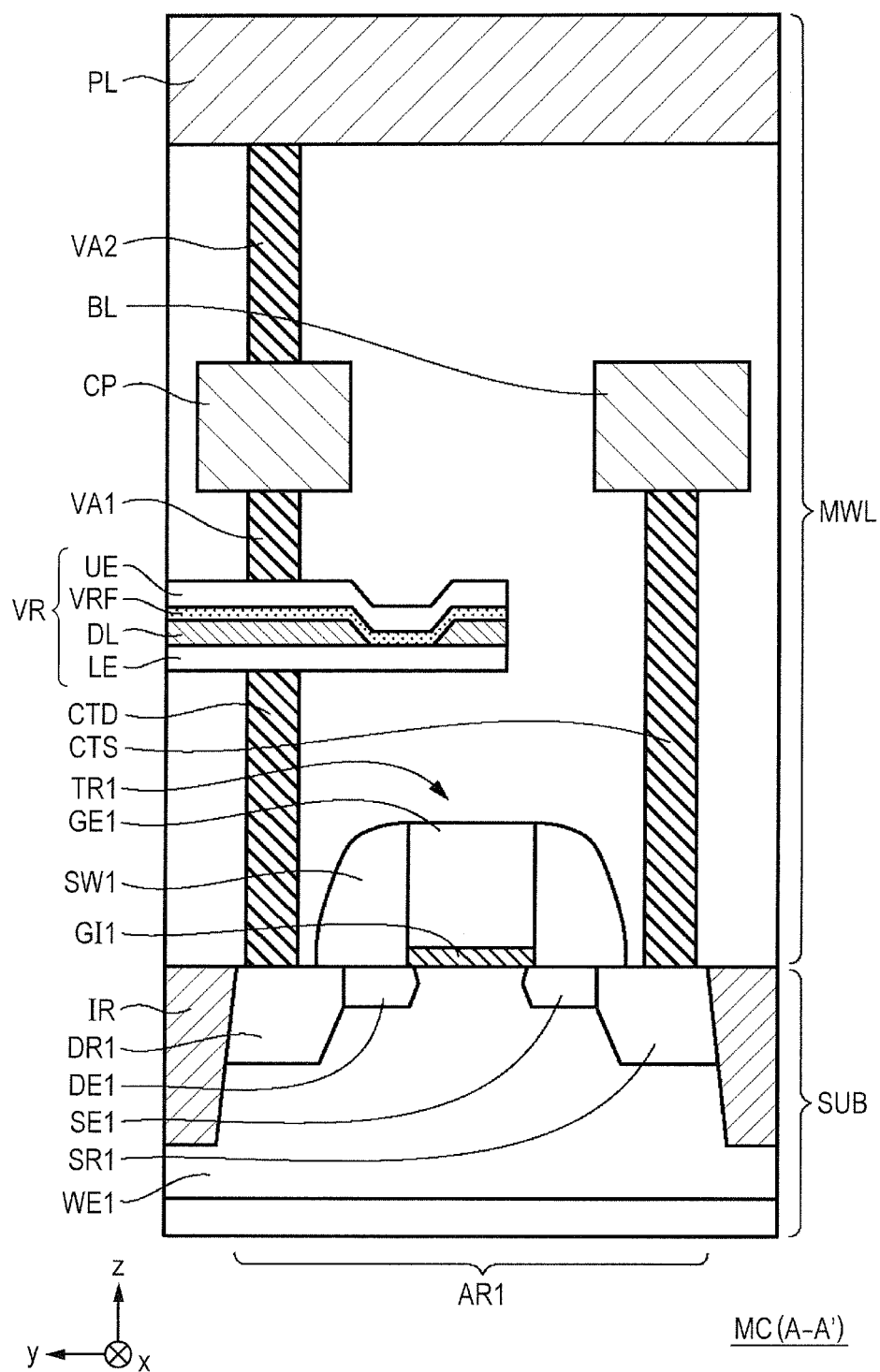
FIG. 5 is a cross-sectional view taken along line A-A' of FIG. 4.

FIG. 3 is a plan view illustrating an exemplary configuration of the memory cell array MCA shown in FIG. 2. FIG. 4 is a diagram obtained when the bit lines BL, the plate lines PL, conductor patterns CP, and vias VA1, VA2 are removed from FIG. 3. FIG. 5 is a cross-sectional view taken along line A-A' of FIG. 4. The planar layout of the memory cell array MCA is not limited to the example shown in FIGS. 3 and 4. Similarly, the cross-section structure of the memory cells MC is not limited to the example shown in FIG. 5.

First of all, the planar layout of wirings (plate lines PL, bit lines BL, and word lines WL) included in the memory cell array MCA will be described with reference to FIG. 3. As shown in FIG. 3, the memory cell array MCA is configured so that the plate lines PL are disposed along a first direction (x-direction), and that the bit lines BL are disposed along a second direction (y-direction) orthogonal to the first direction, and further that the word lines WL are disposed along the second direction (y-direction). Each plate line PL is extended in the second direction (y-direction). Each bit line BL is extended in the first direction (x-direction). Each word line WL is extended in the first direction (x-direction). Further, in the example shown in FIG. 3, a word line WL, a bit line BL, a bit line BL, and a word line WL are repeatedly disposed in the order named along the second direction (y-direction).

Each of the plate lines PL is provided with a plurality of conductor patterns CP. The conductor patterns CP are positioned in a layer beneath the plate lines PL. Further, each conductor pattern CP is provided with the vias VA1, VA2. In the example shown in FIG. 3, a bit line BL, a conductor pattern CP, a conductor pattern CP, and a bit line BL are repeatedly disposed in the order named along the second direction (y-direction).

The planar layout of the memory cells MC will now be described with reference to FIG. 4. As shown in FIG. 4, a plurality of island-shaped active regions AR1 are disposed over the surface of a substrate SUB. Each active region AR1 is surrounded by an isolation region IR in plan view. One transistor TR1 is formed in each active region AR1. The active regions AR1 are electrically insulated from each other by the isolation region IR.

Each of the word lines WL is provided with a plurality of transistors TR1. In a region where a word line WL overlaps with an active region AR1 in plan view, the word line WL serves as the gate electrode of the transistor TR1 (the gate electrode GE1). The transistors TR1 provided for each word line WL have a drain (drain region DR1) on the same side with respect to the word line WL (gate electrode GE1), and have a source (source region SR1) on the side opposite the drain with the word line WL (gate electrode GE1) interposed between the source and the drain.

The layout of the transistors TR1 provided for a word line WL and the layout of the transistors TR1 provided for an adjacent word line WL are line-symmetric with respect to a straight line extended in the first direction (x-direction). In other words, the transistors TR1 disposed along the second direction (y-direction) are configured so that the source region SR1, the gate electrode GE1, the drain region DR1, the drain region DR1, the gate electrode GE1, and the source region SR1 are repeatedly disposed in the order named along the second direction (y-direction). In the example shown in FIG. 4, the drain region DR1 includes a contact CTD, and the source region SR1 includes a contact CTS.

Each transistor TR1 is provided with the variable resistance element VR. Each of the memory cells MC is formed of the transistor TR1 and the variable resistance element VR. In the example shown in FIG. 4, at least a part of the variable resistance element VR overlaps with the drain region DR1 in plan view.

The cross-section structure of the memory cells MC will now be described with reference to FIG. 5. In the example shown in FIG. 5, a well WE1 is formed over the substrate SUB. The transistor TR1 is formed by using the well WE1.

The variable resistance element VR is embedded in a multilayer wiring layer MWL. The multilayer wiring layer MWL is formed, for instance, by silicon oxide film ($SiO_2$).

The isolation region IR is formed over the surface of the substrate SUB. As shown in FIG. 5, the active region AR1 is defined by the isolation region IR. The isolation region IR is formed, for instance, by shallow trench isolation (STI) or local oxidation of silicon (LOCOS).

One transistor TR1 is formed in the active region AR1. The transistor TR1 has the gate electrode GE1 over the substrate SUB and has the source region SR1 and the drain region DR1 over the substrate SUB. The gate electrode GE1 is formed, for instance, of polysilicon.

The transistor TR1 has a gate insulating film GI1 between the gate electrode GE1 and the substrate SUB, and has a sidewall SW1 over a lateral surface of the gate electrode GE1. The gate insulating film GI1 is formed, for instance, of a silicon oxide film ($SiO_2$) or a high-k material (for example, hafnium oxide ($HfO_2$) or yttrium oxide ($Y_2O_3$)). The sidewall SW1 is formed, for instance, of a silicon oxide film ($SiO_2$) or a silicon nitride film (SiN).

The transistor TR1 has a source extension region SE1 and a drain extension region DE1 over the substrate SUB. The source extension region SE1 is formed between the gate electrode GE1 and the source region SR1 in plan view. The drain extension region DE1 is formed between the gate electrode GE1 and the drain region DR1 in plan view. The source extension region SE1 is lower in impurity concentration than the source region SR1. Similarly, the drain extension region DE1 is lower in impurity concentration than the drain region DR1. Further, the source extension region SE1 is shallower than the source region SR1. Similarly, the drain extension region DE1 is shallower than the drain region DR1.

The transistor TR1 is covered by the multilayer wiring layer MWL. The multilayer wiring layer MWL includes the contact CTS, the contact CTD, the variable resistance element VR, the via VA1, the conductor pattern CP, the bit line BL, the via VA2, and the plate line PL. In the example shown in FIG. 5, the variable resistance element VR is embedded in a wiring layer (one layer in the multilayer wiring layer MWL). The bit line BL and the conductor pattern CP are embedded in the same wiring layer and positioned in a layer above the variable resistance element VR. The plate line PL is embedded in a wiring layer above the bit line BL and the conductor pattern CP.

The source region SR1 of the transistor TR1 is coupled to the bit line BL though the contact CTS. The drain region DR1 of the transistor TR1 is coupled to the variable resistance element VR through the contact CTD. The variable resistance element VR is coupled to the plate line PL through the via VA1, the conductor pattern CP, and the via VA2.

The variable resistance element VR includes a lower electrode LE, a dielectric layer DL, a variable resistance film VRF, and an upper electrode UE. The lower electrode LE, the dielectric layer DL, the variable resistance film VRF, and the upper electrode UE are layered in the order named. In the example shown in FIG. 5, a concave portion penetrating through the dielectric layer DL is formed in the dielectric layer DL. The variable resistance film VRF and the upper electrode UE are embedded in the concave portion. This brings the variable resistance film VRF into contact with the lower electrode LE.

The structure of the variable resistance element VR is not limited to the example shown in FIG. 5. For example, the variable resistance element VR need not include the dielectric layer DL. If the variable resistance element VR does not include the dielectric layer DL, the lower electrode LE, the variable resistance film VRF, and the upper electrode UE are layered in the order named. In this instance, the lower electrode LE, the variable resistance film VRF, and the upper electrode UE are all shaped like a plate.

As described in detail later, when the variable resistance film VRF is subjected to forming, its electrical resistance decreases. When a voltage is applied to the variable resistance film VRF after forming, the variable resistance film VRF switches from a high-resistance state to a low-resistance state or from the low-resistance state to the high-resistance state. A film having such characteristics is used as the variable resistance film VRF.

More specifically, the variable resistance film VRF is formed, for instance, of a metal oxide (for example, a tantalum oxide, a titanium oxide, a zirconium oxide, or a hafnium oxide). In this instance, the variable resistance film may be either a monolayer film or a multilayer film. When the variable resistance film VRF is a multilayer film, the variable resistance film VRF is formed of layers that differ in the combination of chemical elements. Alternatively, the variable resistance film VRF may be formed of layers having the same combination of chemical elements. In such an alternative case, however, the layers of the variable resistance film VRF differ from each other in oxygen composition ratio. The film thickness of the variable resistance film VRF is within the range of 1.5 nm to 30 nm.

The lower electrode LE is formed of a metal (for example, ruthenium, titanium nitride, tantalum, tantalum nitride, tungsten, palladium, or platinum). Similarly, the upper electrode UE is formed of a metal (for example, ruthenium, titanium nitride, tantalum, tantalum nitride, tungsten, palladium, or platinum). The dielectric layer DL is formed, for instance, of a silicon oxide film ($SiO_2$) or a silicon nitride film (SiN).

Figure 6:
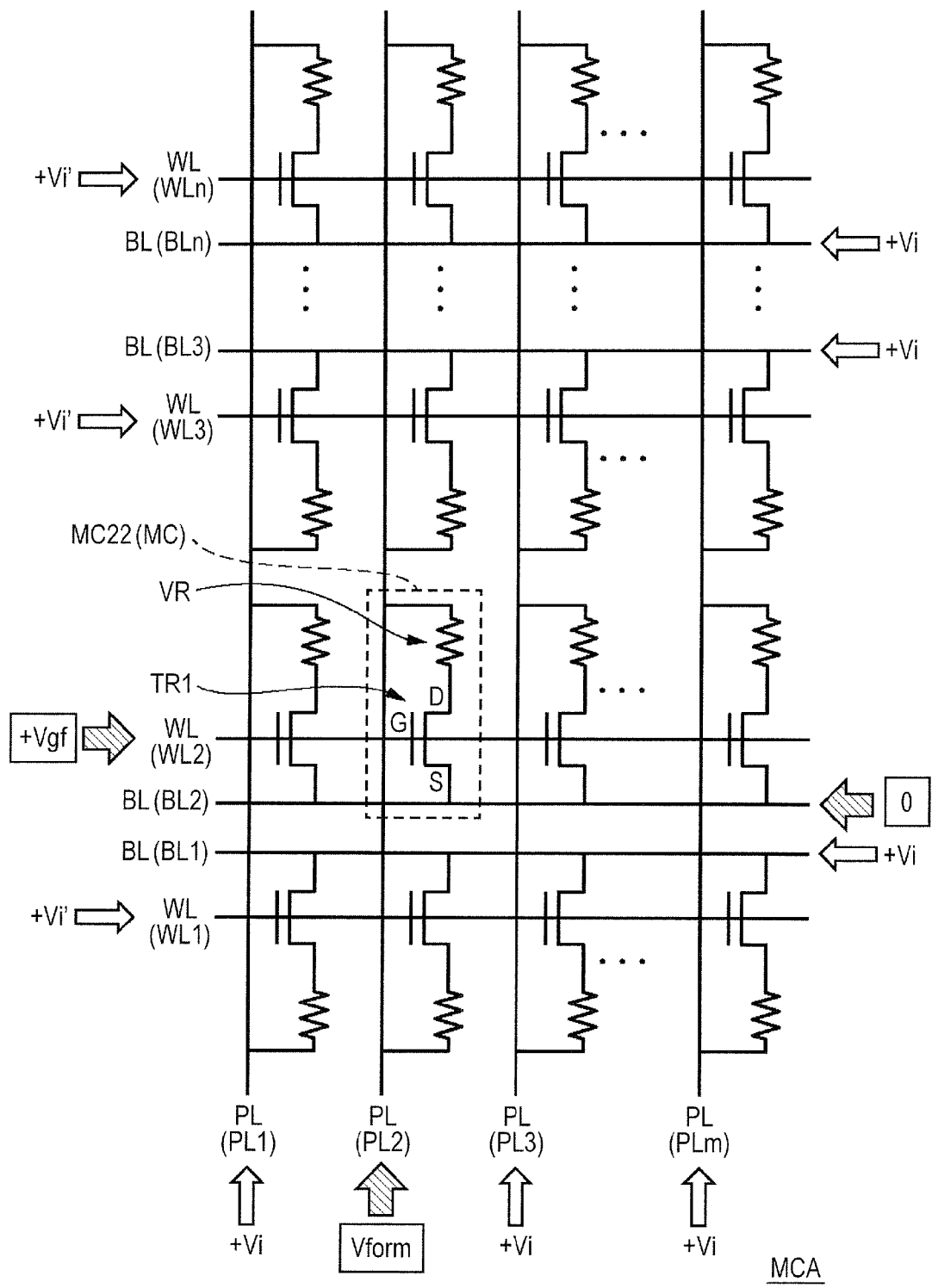
FIG. 6 is a diagram illustrating a forming method according to the first embodiment.

FIG. 6 is a diagram illustrating a forming method according to the first embodiment, and corresponds to FIG. 2. In the example shown in FIG. 6, the variable resistance element VR of a selected memory cell MC22 (a memory cell MC enclosed by a broken line) is subjected to forming. The selected memory cell is coupled to a plate line PL2, a bit line BL2, and a word line WL2.

As shown in FIG. 6, the potential of the plate line PL2 is a forming voltage Vform. However, the potentials of the other plate lines PL are +Vi. The potential of the bit line BL2 is 0 V (ground potential). However, the potentials of the other bit lines BL are +Vi. The potential of the word line WL2 is +Vgf. However, the potentials of the other word lines WL are +Vi'.

In the selected memory MC 22, the transistor TR1 is on. In other words, the voltage Vgf of the word line WL2 is a voltage at which the transistor TR1 in the selected memory cell MC22 turns on. More specifically, the voltage Vgf is, for example, 1.2 V.

In the selected memory cell MC22, the voltage between the plate line PL2 and the bit line BL2 is the difference between the potential (Vform) of the plate line PL2 and the potential (0 V) of the bit line BL2 and is equivalent to the forming voltage Vform. The forming voltage Vform is a high voltage of 3 V or higher. When the potential of the plate line PL2 with respect to the bit line BL2 is +Vform, the variable resistance element VR is subjected to forming. In this instance, the resistance of the variable resistance element VR decreases. More specifically, for example, the resistance of the variable resistance element VR is higher than 10 MΩ before forming and is approximately 10 kΩ immediately after forming.

As described in detail later, when data is written into the variable resistance element VR after forming, the variable resistance element VR can enter either the high-resistance state or the low-resistance state. In the example shown in FIG. 6, the variable resistance element VR enters the low-resistance state immediately after forming.

Referring to the example shown in FIG. 6, in each memory cell MC (except the selected memory cell MC22) coupled to the plate line PL2, the voltage between the plate line PL2 and the bit lines BL is the difference between the potential (Vform) of the plate line PL2 and the potential (Vi) of the bit lines BL, that is, equal to Vform−Vi. The potential Vi is higher than 0 V (ground potential) and lower than the potential Vform. More specifically, the potential Vi is, for example, 1.0 V. In this instance, the voltage between the plate line PL2 and the bit lines BL is lower than Vform. In other words, the voltage between the plate line PL2 and the bit lines BL is relaxed by the potentials Vi of bit lines BL other than the bit line BL2. Thus, the drain-source withstand voltage of the transistor TR1 can be decreased as described in detail later. In other words, the area of the transistor TR1 can be reduced.

Further, referring to the example shown in FIG. 6, in each memory cell MC (except the selected memory cell MC22) coupled to the plate line PL2, the voltage between the plate line PL2 and the word lines WL is the difference between the potential (Vform) of the plate line PL2 and the potential (Vi') of the word lines BL, that is, equal to Vform−Vi'. The potential Vi' is higher than 0 V (ground potential) and lower than the potential Vform. More specifically, the potential Vi' is, for example, 1.0 V. In this instance, the voltage between the plate line PL2 and the word lines WL is lower than Vform. In other words, the voltage between the plate line PL2 and the word lines WL is relaxed by the potentials Vi' of word lines WL other than the word line WL2. Thus, the gate-drain withstand voltage of the transistor TR1 can be decreased as described in detail later.

Furthermore, referring to the example shown in FIG. 6, in each memory cell MC coupled to bit lines BL other than the bit line BL2, the transistor TR1 is set to not turn on. More specifically, Vi' is lower than Vi+Vth (Vi'<Vi+Vth). Vth is a threshold voltage of the transistor TR1. In each of the above-described memory cells MC, when Vi' is lower than Vi+Vth, the potential of the word lines WL (gate electrode (G)) with respect to the bit lines BL (source (S)) is lower than Vth. Thus, the transistor TR1 in each of the above-described memory cells MC is set to not turn on.

Moreover, referring to the example shown in FIG. 6, in each memory cell MC that differs from the selected memory cell MC22 in both the plate lines PL and the bit lines BL, the voltage between the plate lines PL and the bit lines BL is the difference between the potential (Vi) of the plate lines PL and the potential (Vi) of the bit lines BL, that is, 0 V. In this instance, in the above-described memory cells MC, the voltage between the drain (D) and the source (S) is 0 V. Consequently, in each of the above-described memory cells MC, a current is prevented from flowing into the transistor TR1.

It is necessary that the potential of the bit line BL2 serve as a reference potential for the other lines (for example, the word lines WL and the plate lines PL). As such being the case, the potential of the bit line BL2 is not limited to 0 V (ground potential).

Figure 7:
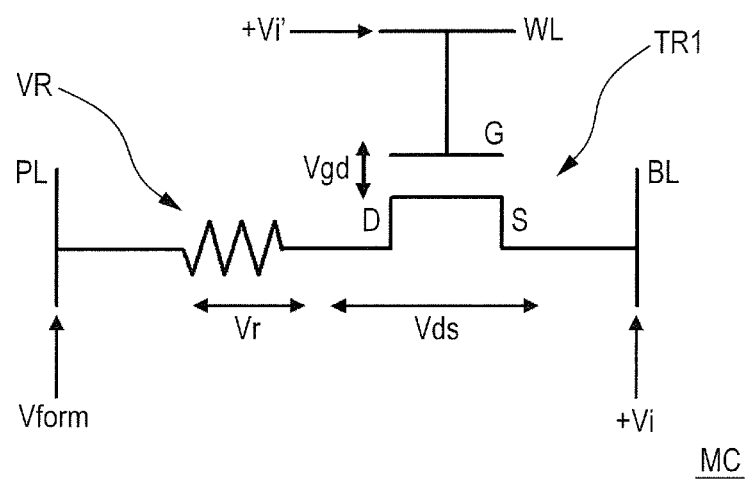
FIG. 7 is a diagram illustrating the withstand voltage of a transistor.

FIG. 7 is a diagram illustrating the withstand voltage of the transistor TR1. In the example shown in FIG. 7, the transistor TR1 configures a memory cell MC. The potential of the plate lines PL is Vform. The potentials of the bit lines BL are +Vi. The potentials of the word lines WL are +Vi'. In other words, the memory cell MC shown in FIG. 7 corresponds to one of the memory cells MC (except the selected memory cell MC22) coupled to the plate line PL2 as shown in FIG. 6.

As shown in FIG. 7, the voltage Vform−Vi between the plate lines PL and the bit lines BL is divided into a voltage Vr of the variable resistance element VR and a drain-source voltage Vds. In other words, the drain-source voltage Vds decreases to be lower than the voltage between the plate lines PL and the bit lines BL by the voltage Vr of the variable resistance element VR. When a current Ic flows into a memory cell, the voltage Vr is a product of the current Ic and the resistance value R of the variable resistance element VR. Further, a gate-drain voltage Vgd is lower than the voltage Vform−Vi' between the plate lines PL and the word lines WL by the voltage Vr of the variable resistance element VR.

As described above, the resistance of the variable resistance element VR decreases after forming. Therefore, after forming of the variable resistance element VR, the proportion of the drain-source voltage Vds (divided voltage) in the voltage Vform−Vi between the plate lines PL and the bit lines BL increases. Similarly, the proportion of the gate-drain voltage Vgd (divided voltage) in the voltage Vform−Vi' between the plate lines PL and the word lines WL increases. When the transistor TR1 is off, no current flows to a cell, that is, Ic≈0. Thus, Vr≈0. Consequently, Vform−Vi (the voltage between the plate lines PL and the bit lines BL) is applied almost entirely between the drain and the source (Vds≈Vform−Vi), and Vform−Vi' (the voltage between the plate lines PL and the word lines WL) is applied almost entirely between the gate and the drain (Vgd≈Vform−Vi').

In the example shown in FIG. 7, the drain-source withstand voltage can be made lower than Vform. In other words, in the example shown in FIG. 7, when the voltage between the plate lines PL and the bit lines BL is Vform in a state where the transistor TR1 is off after forming of the variable resistance element VR, the transistor TR1 may break down between the drain and the source.

More specifically, in the selected memory cell MC22 shown in FIG. 6, the voltage between the plate lines PL and the bit lines BL is Vform, and the transistor is on. Before forming, the resistance of the variable resistance element VR is extremely higher than the resistance of the transistor in the "on" state, Vform is applied almost entirely to the variable resistance element VR, and the drain-source voltage Vds is low. After forming, the proportion of the drain-source voltage Vds in the voltage Vform between the plate lines PL and the bit lines BL increases. However, a current flows into the memory cell so that the drain-source voltage Vds is lower than Vform by Vr. Meanwhile, in the memory cells MC (except the selected memory cell MC22) coupled to the plate lines PL2 as shown in FIG. 6, the transistor is off, and the drain-source voltage Vds is substantially equal to the voltage Vform−Vi between the plate lines PL and the bit lines BL. In either of the above cases, therefore, the drain-source voltage Vds is lower than Vform. Consequently, the drain-source withstand voltage can be made lower than Vform.

Further, in the example shown in FIG. 7, the gate-drain withstand voltage can be made lower than Vform. In other words, in the example shown in FIG. 7, when the voltage between the plate lines PL and the word lines WL is Vform after forming of the variable resistance element VR, the transistor TR1 may break down between the gate and the drain.

More specifically, in the selected memory cell MC22 shown in FIG. 6, the voltage between the plate lines PL and the word lines WL is Vform−Vgf, and the gate-drain voltage Vgd of the transistor is lower than Vform before and after forming. Further, in the memory cells MC (except the selected memory cell MC22) coupled to the plate line PL2 as shown in FIG. 6, the transistor is off, and the gate-drain voltage Vgd is substantially equal to the voltage Vform−Vi' between the plate lines PL and the word lines WL and lower than Vform. Consequently, the gate-drain withstand voltage can be made lower than Vform.

Figure 8A:
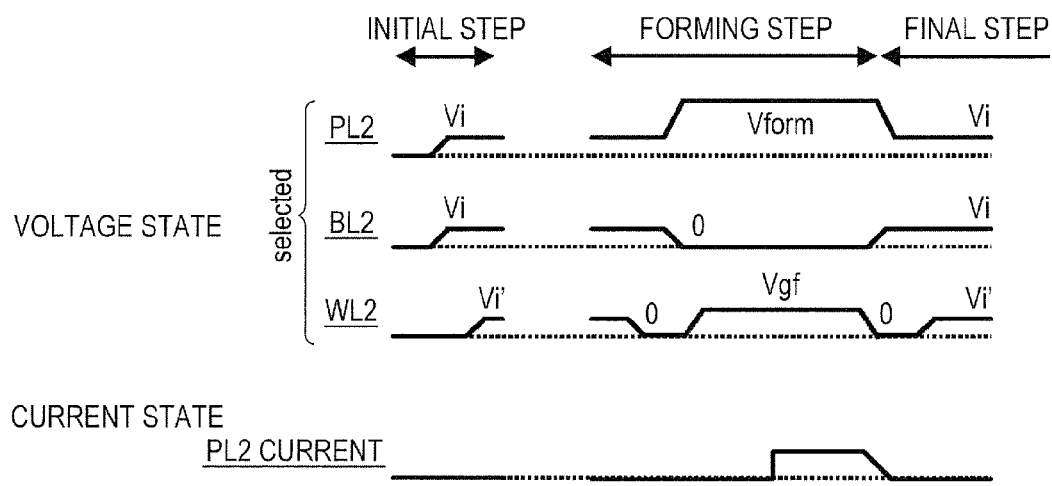
FIGS. 8A and 8B are diagrams illustrating an example of voltage control in the forming method according to the first embodiment.
Figure 8B:
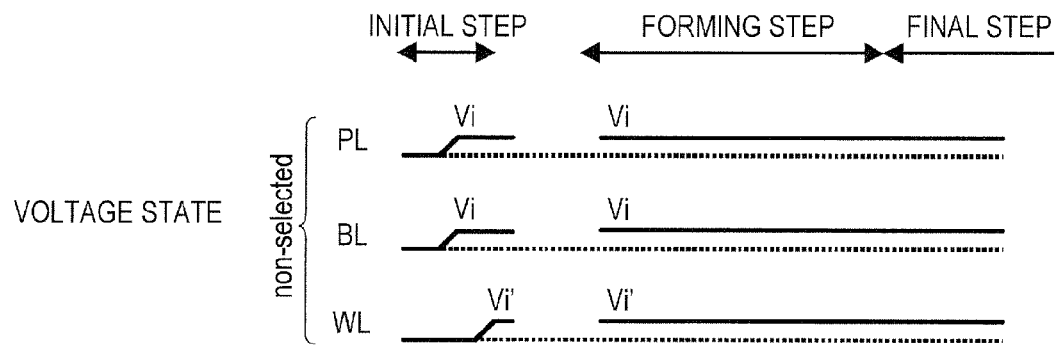

FIGS. 8A and 8B are diagrams illustrating an example of voltage control in the forming method according to the present embodiment. In the example shown in FIGS. 8A and 8B, the variable resistance element VR of the selected memory cell MC22 shown in FIG. 6 is subjected to forming. FIG. 8A shows the voltage states of selected lines (the plate line PL2, the bit line BL2, and the word line WL2) to be coupled to the selected memory cell MC22 and the current state of the plate line PL2. FIG. 8B shows the voltage states of non-selected lines (plate lines PL, bit lines BL, and word lines WL other than the plate line PL2, the bit line BL2, and the word line WL2).

First of all, as indicated in an initial step of FIG. 8A and in the initial step of FIG. 8B, the potentials of all plate lines PL are increased from 0 V to Vi and the potentials of all bit lines are increased from 0 V to Vi. Next, the potentials of all word lines WL are increased from 0 V to Vi'.

Next, as indicated in a forming step of FIG. 8A, the potential of the word line WL2 is decreased from Vi' to 0 V. Next, the potential of the plate line PL2 is increased from Vi to the forming voltage Vform, the potential of the bit lines BL is decreased from Vi to 0 V, and the potential of the word line WL2 is increased from 0 V to Vgf. In this instance, the voltage between the plate line PL2 and the bit lines BL is Vform. Thus, the variable resistance element VR (FIG. 6) is subjected to forming. In this instance, the resistance of the variable resistance element VR decreases. In such an instance, a current flows to the plate line PL2 as indicated in the current state of FIG. 8A.

As indicated in the forming step of FIG. 8B, the potentials of the non-selected lines (plate lines PL, bit lines BL, and word lines WL) remain the same as indicated in the initial step. More specifically, the potentials of the plate lines PL remain at Vi, the potentials of the bit lines BL remain at Vi, and the potentials of the word lines WL remain at Vi'.

In the above-described case, in each memory cell MC (except the selected memory cell MC22) to be coupled to the plate line PL2 (FIG. 6), the voltage between the plate line PL2 (potential Vform) and the bit lines BL (potential Vi) is Vform−Vi. Consequently, the drain-source withstand voltage of the transistor TR1 can be decreased as described above.

Further, in the above-described case, in each memory cell MC (except the selected memory cell MC22) to be coupled to the plate line PL2 (FIG. 6), the voltage between the plate line PL2 (potential Vform) and the word lines WL (potential Vi') is Vform−Vi'. Consequently, the gate-drain withstand voltage of the transistor TR1 can be decreased as described above.

Furthermore, in the above-described case, in memory cells MC that differs from the selected memory cell MC22 in both the plate lines PL and the bit lines BL (FIG. 6), the voltage between the plate lines PL (potential Vi) and the bit lines BL (potential Vi) is 0 V. In this instance, in the above-described memory cells MC, the voltage between the drain (D) and the source (S) is 0 V. Consequently, in the above-described memory cells MC, a current is prevented from flowing into the transistor TR1.

Next, as indicated in a final step of FIG. 8A, the potential of the plate line PL2 is decreased from Vform to Vi, the potential of the bit lines BL is increased from 0 V to Vi, and the potential of the word lines WL is decreased from Vgf to 0 V. Next, the potential of the word lines WL is increased from 0 V to Vi'.

The above-described process is also applied to memory cells MC other than the selected memory cell MC22. In this manner, the variable resistance element VR is subjected to forming in all memory cells MC included in the memory cell array MCA (FIG. 6).

If, in the forming step shown in FIG. 8A, the potential of the plate line PL2 is the forming voltage Vform and the potential of the word line WL2 is 0 V, the voltage between the plate line PL2 and the word line WL2 is Vform. From the viewpoint of the gate-drain withstand voltage (for example, FIG. 7), it is not preferred that the voltage between the plate line PL2 and the word line WL2 be Vform. Therefore, it is preferred, in the forming step, that the voltage of the plate line PL2 be increased (increased from 0 V to Vform) at the same time the voltage of the word line WL2 is increased (increased from 0 V to Vgf). If the voltage of the word line WL2 is to be increased later than a voltage increase in the plate line PL2, it is preferred that the time interval between a voltage increase in the plate line PL2 and a voltage increase in the word line WL2 be minimized.

Further, if, in the final step shown in FIG. 8A, the potential of the plate line PL2 is the forming voltage Vform and the potential of the word line WL2 is 0 V, the voltage between the plate line PL2 and the word line WL2 is Vform. From the viewpoint of the gate-drain withstand voltage (for example, FIG. 7), it is not preferred that the voltage between the plate line PL2 and the word line WL2 be Vform. Therefore, it is preferred in the final step that the voltage of the plate line PL2 be decreased (decreased from Vform to Vi) at the same time the voltage of the word line WL2 is decreased (decreased from Vgf to 0 V). If the voltage of the word line WL2 is to be decreased earlier than a voltage decrease in the plate line PL2, it is preferred that the time interval between a voltage decrease in the plate line PL2 and a voltage decrease in the word line WL2 be minimized.

Figure 9A:
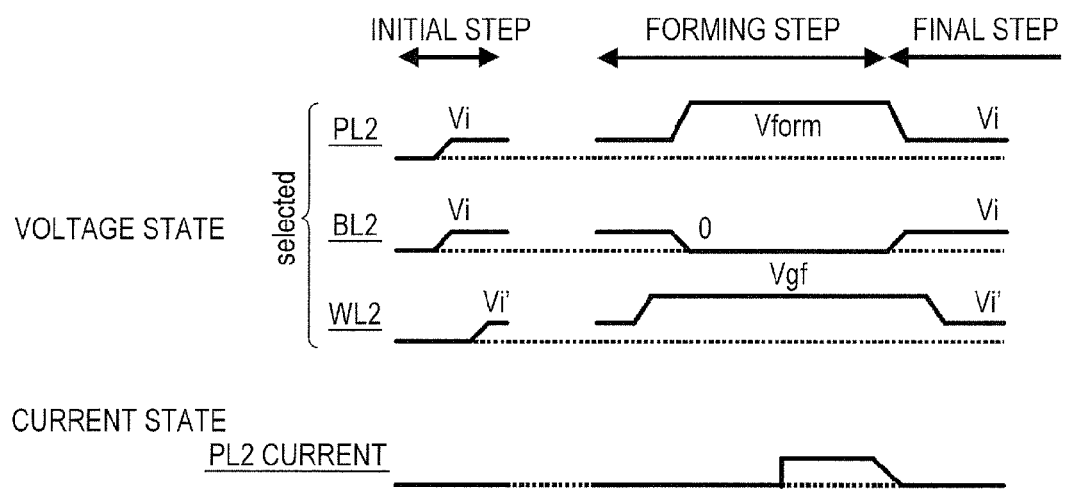
FIGS. 9A and 9B are diagrams illustrating a first modification of voltage control shown in FIGS. 8A and 8B.
Figure 9B:
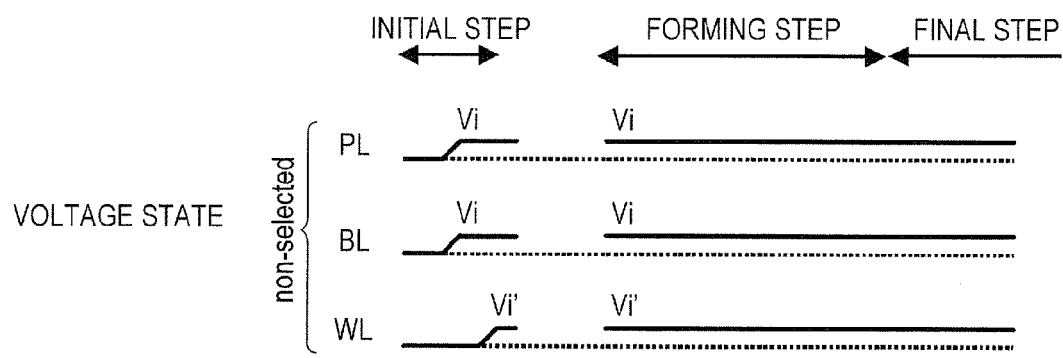

FIGS. 9A and 9B are diagrams illustrating a first modification of FIGS. 8A and 8B. As indicated in the forming step of FIG. 9A, the voltage of the word line WL2 may be directly increased from Vi' to Vgf. In the example shown in FIG. 9A, the voltage of the word line WL2 is increased (increased from Vi' to Vgf) before a voltage increase in the plate line PL2 (a voltage increase from Vi to Vform).

Further, as indicated in the final step of FIG. 9A, the voltage of the word line WL2 may be directly decreased from Vgf to Vi'. In the example shown in FIG. 9A, the voltage of the word line WL2 is decreased (decreased from Vgf to Vi') after a voltage decrease in the plate line PL2 (a voltage decrease from Vform to Vi).

Figure 10A:
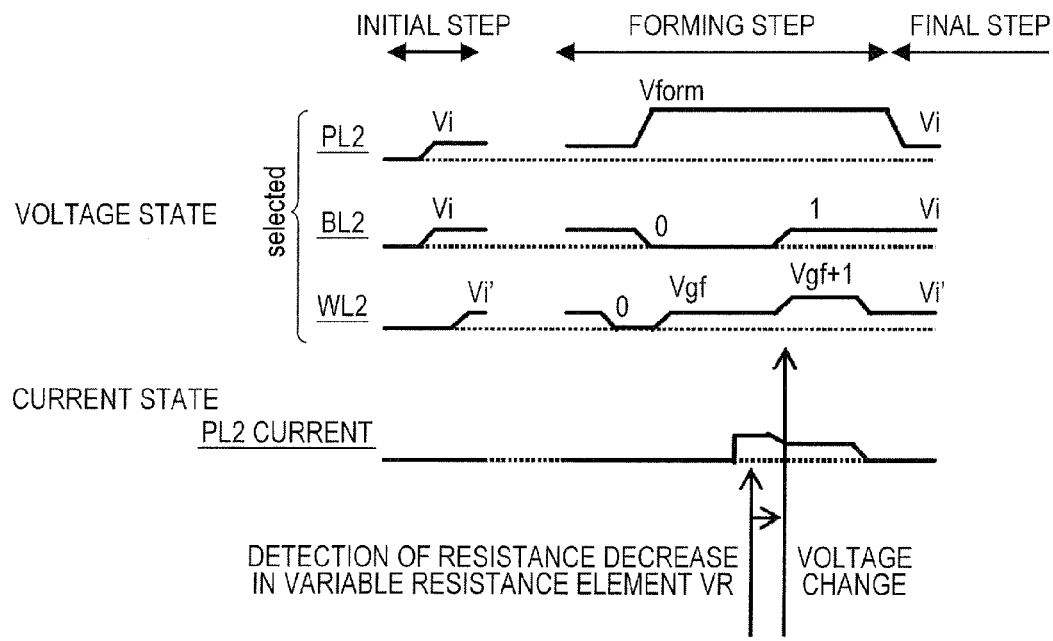
FIGS. 10A and 10B are diagrams illustrating a second modification of voltage control shown in FIGS. 8A and 8B.
Figure 10B:
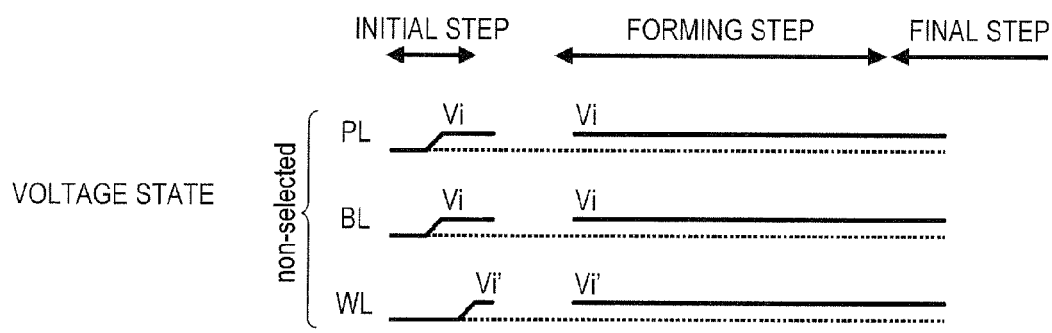

FIGS. 10A and 10B are diagrams illustrating a second modification of FIGS. 8A and 8B. As indicated in the forming step of FIG. 10A, if a resistance decrease in the variable resistance element VR is detected (if the current in the plate line PL2 is found to be not smaller than a reference value), the potential of the bit line BL2 and the potential of the word line WL2 may be increased. This reduces a voltage stress that is applied in the forming step to a drain-source path and gate-drain path of the transistor TR1 in the selected memory cell MC22 (FIG. 6).

More specifically, as indicated in the forming step of FIG. 10A, the voltage between the plate line PL2 and the bit line BL2 is Vform before a current flows in the plate line PL2.

Further, the voltage between the plate line PL2 and the word line WL2 is Vform−Vgf before the current flows in the plate line PL2. If, in this instance, the voltages of the plate line PL2 and bit line BL2 remain at the level of the forming voltage Vform after the current in the plate line PL2 is not smaller than the reference value (that is, after a decrease in the resistance of the variable resistance element VR (FIG. 6)), a great voltage stress is applied to the drain-source path of the transistor TR1 (FIG. 6). Similarly, if the voltages of the plate line PL2 and word line WL2 remain at the level of Vform−Vgf after the current flows in the plate line PL2, a great voltage stress is applied to the gate-drain path of the transistor TR1 (FIG. 6).

In the example shown in FIGS. 10A and 10B, the above-mentioned voltage stress is reduced by increasing the potential of the bit line BL2 and the potential of the word line WL2 after the current in the plate line PL2 is not smaller than the reference value. More specifically, in the example shown in FIGS. 10A and 10B, the voltage of the bit line BL2 is increased by 1 V and the voltage of the word line WL2 is increased by 1 V. However, the voltage increase in the bit line BL2 and the voltage increase in the plate line PL2 are not limited to the example (+1 V) shown in FIGS. 10A and 10B.

Figure 11A:
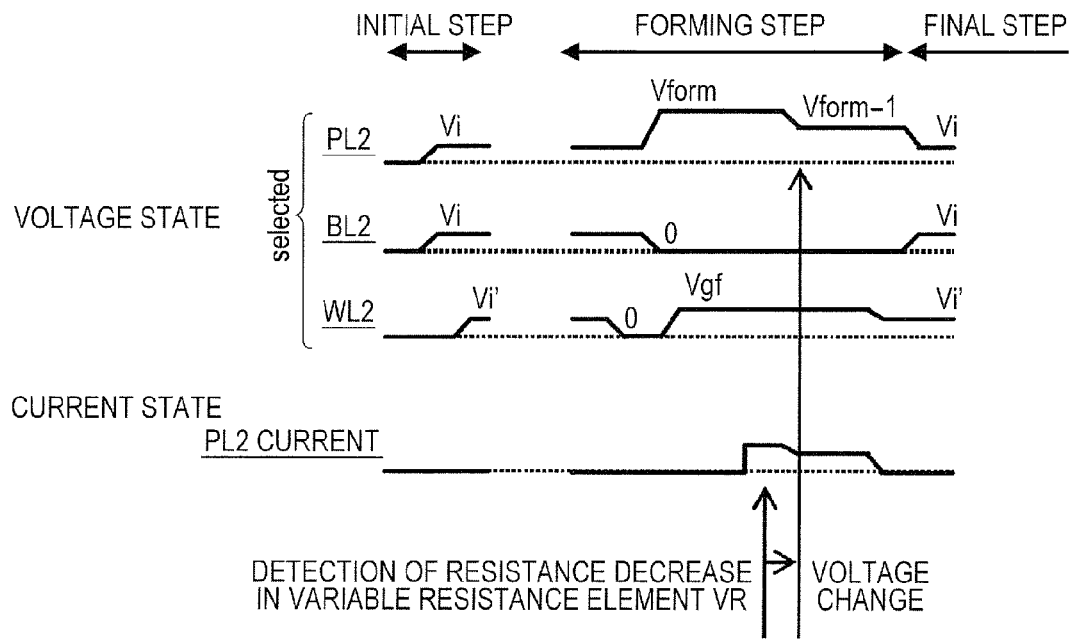
FIGS. 11A and 11B are diagrams illustrating a third modification of voltage control shown in FIGS. 8A and 8B.
Figure 11B:
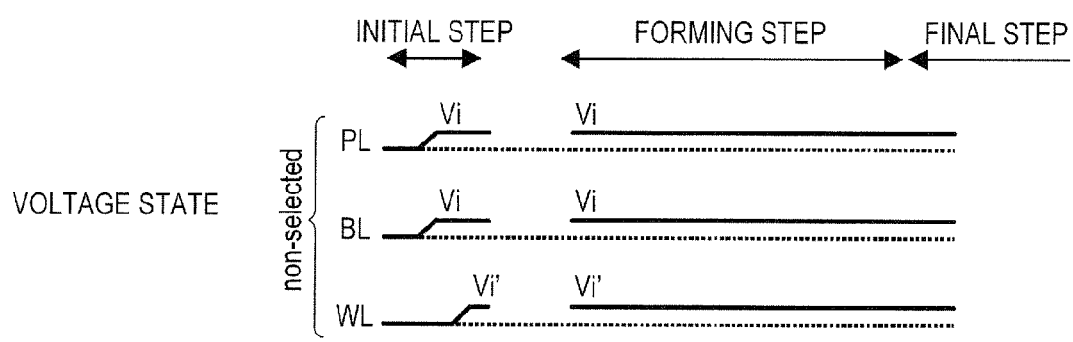

FIGS. 11A and 11B are diagrams illustrating a third modification of FIGS. 8A and 8B. As indicated in the forming step of FIG. 11A, if a resistance decrease in the variable resistance element VR is detected (if the current in the plate line PL2 is found to be not smaller than the reference value), the potential of the plate line PL2 may be decreased. This reduces a voltage stress that is applied in the forming step to the drain-source path and gate-drain path of the transistor TR1 in the selected memory cell MC22 (FIG. 6).

In the example shown in FIGS. 11A and 11B, the voltage stress described with reference to FIGS. 10A and 10B is reduced by decreasing the potential of the plate line PL2 after the current in the plate line PL2 is not smaller than the reference value. More specifically, in the example shown in FIGS. 11A and 11B, the voltage of the plate line PL2 is decreased by 1 V. However, the voltage decrease in the plate line PL2 is not limited to the example (−1 V) shown in FIGS. 11A and 11B.

Figure 12:
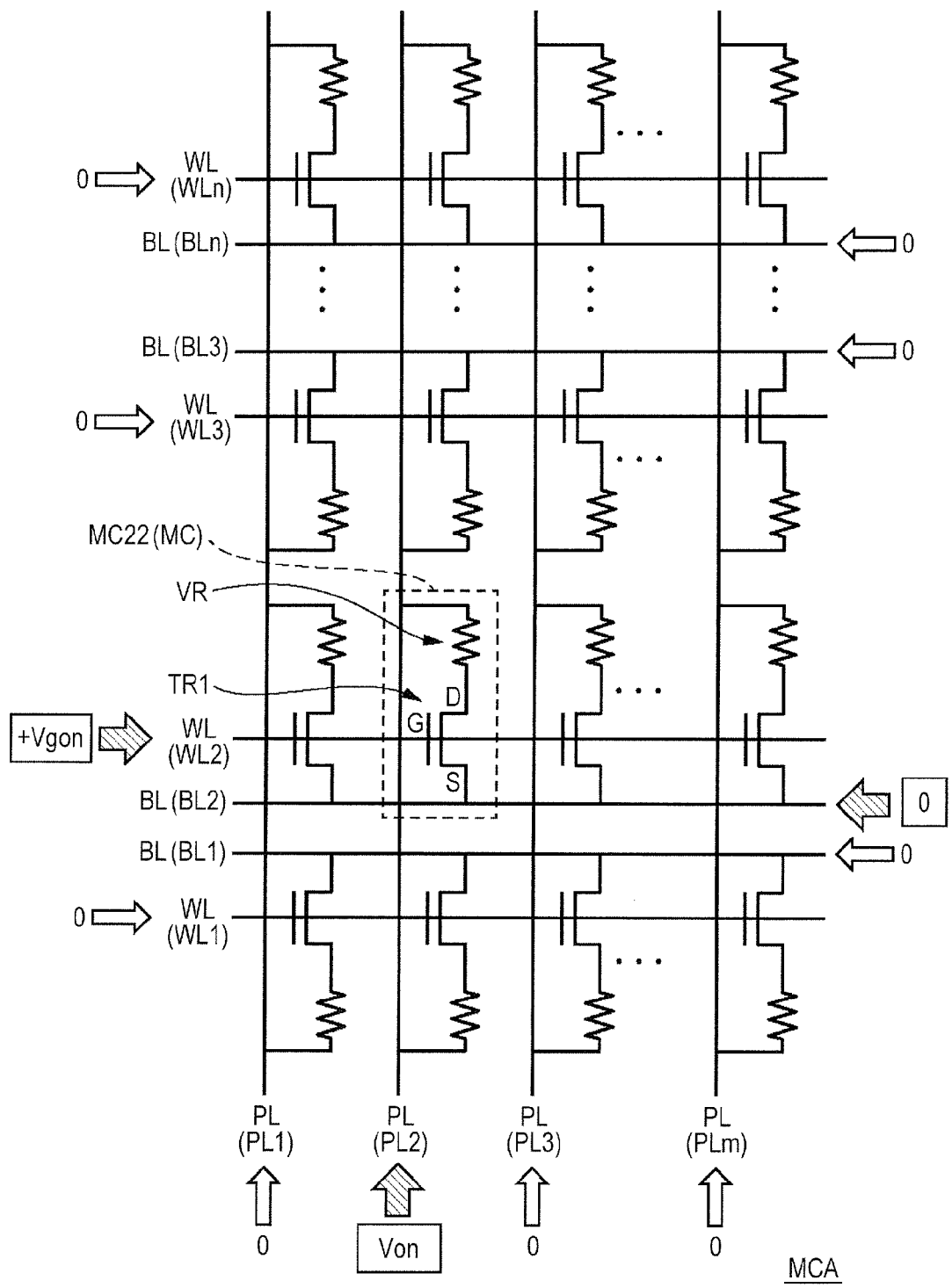
FIG. 12 is a diagram illustrating a first write method according to the first embodiment.

FIG. 12 is a diagram illustrating a first write method according to the present embodiment, and corresponds to FIG. 2. In the example shown in FIG. 12, the variable resistance element VR of the selected memory cell MC22 (a memory cell MC enclosed by a broken line) is switched from the high-resistance state to the low-resistance state. The selected memory cell MC22 is coupled to the plate line PL2, the bit line BL2, and the word line WL2. Further, in the example shown in FIG. 12, the variable resistance element VR in each memory cell MC is subjected to forming.

As shown in FIG. 12, the potential of the plate line PL2 is a voltage Von. By contrast, the potentials of the other plate lines PL are 0 V (ground potential). The potential of the bit line BL2 is 0 V (ground potential). Similarly, the potentials of the other bit lines BL are also 0 V (ground potential). The potential of the word line WL2 is +Vgon. By contrast, the potentials of the other word lines WL are 0 V (ground potential).

In the selected memory cell MC22, the transistor TR1 is on. In other words, the voltage Vgon of the word line WL2 (the word line WL to be coupled to the selected memory cell MC22) is a voltage at which the transistor TR1 in the selected memory cell MC22 turns on. More specifically, the voltage Vgon is, for example, 1.2 V. By contrast, in each memory cell MC to be coupled to a word line WL other than the word line WL2 (the word line to be coupled to the selected memory cell MC22), the transistor TR1 is off.

In the selected memory cell MC22, the voltage between the plate line PL2 and the bit line BL2 is the difference between the potential (Von) of the plate PL2 and the potential (0 V (ground potential)) of the bit line BL2, that is, Von. The voltage Von is, for example, approximately 2.5 V and lower than the aforementioned forming voltage Vform (for example, FIG. 6). When the potential of the plate line PL2 with respect to the bit line BL2 is +Von, the variable resistance element VR switches from the high-resistance state (for example, higher than 100 kΩ) to the low-resistance state (for example, approximately 10 kΩ).

In the example shown in FIG. 12, the transistor TR1 in each memory cell (except the selected memory cell MC22) to be coupled to the plate line PL2 does not break down when its drain-source voltage Vds is Von. This makes it possible to suppress the occurrence of disturbance (switching of the variable resistance element VR in a non-selected memory cell MC from the high-resistance state to the low-resistance state).

More specifically, referring to the example shown in FIG. 12, in each of the above-described memory cells MC, the voltage between the plate line PL2 and the bit lines BL is the difference between the potential (Von) of the plate line PL2 and the potential (0 V (ground voltage)) of the bit lines BL, that is, Von. In each of the above-described memory cells MC, the transistor TR1 is off. In this instance, the drain-source voltage Vds≈Von. Further, in each of the above-described memory cells MC, the drain-source withstand voltage is higher than Von. In this instance, the transistor TR1 in the above-described memory cells is prevented from breaking down between the source and the drain.

Figure 13:
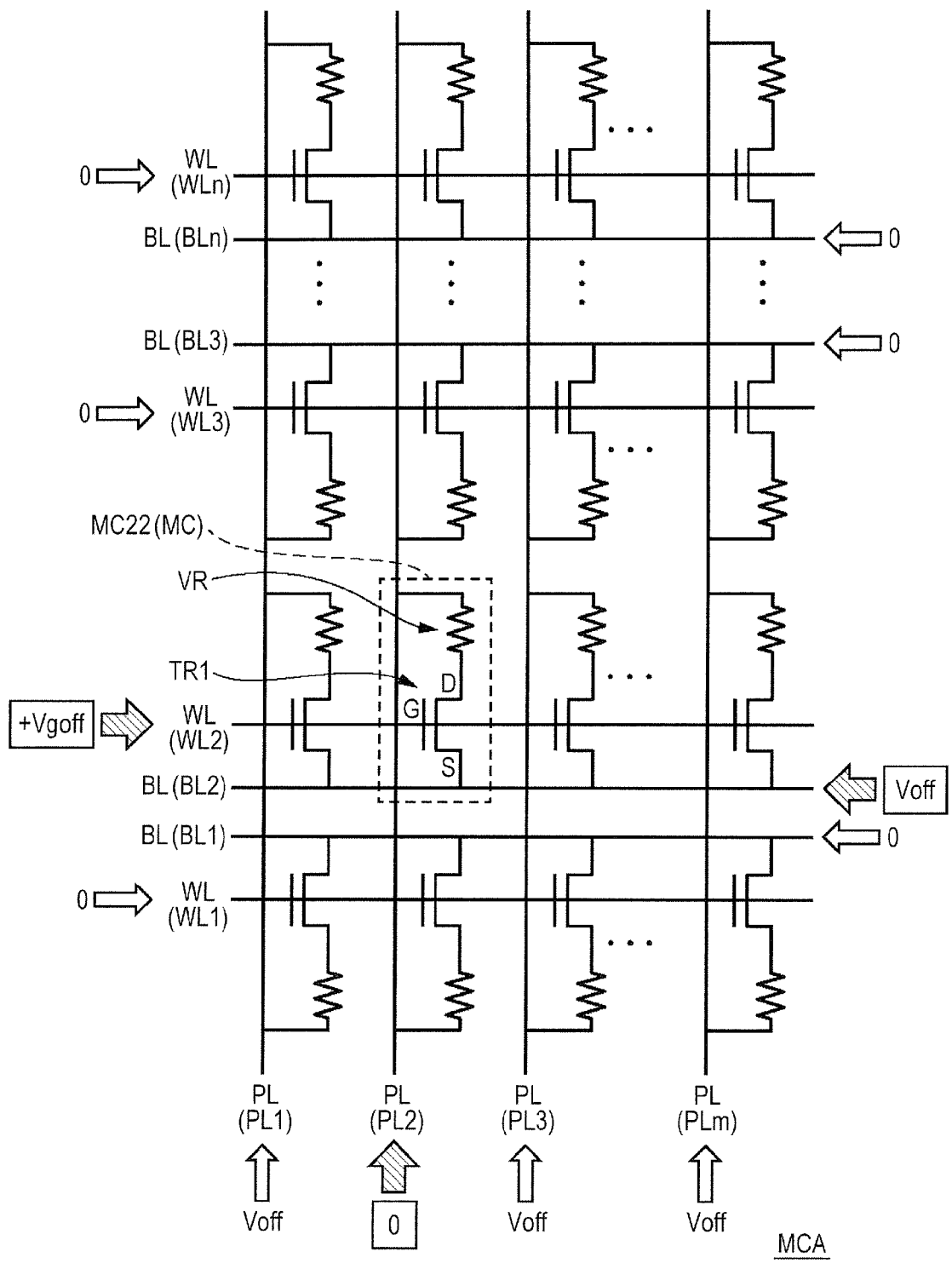
FIG. 13 is a diagram illustrating a second write method according to the first embodiment.

FIG. 13 is a diagram illustrating a second write method according to the present embodiment, and corresponds to FIG. 2. In the example shown in FIG. 13, the variable resistance element VR of the selected memory cell MC22 (a memory cell MC enclosed by a broken line) is switched from the low-resistance state to the high-resistance state. The selected memory cell MC22 is coupled to the plate line PL2, the bit line BL2, and the word line WL2. Further, in the example shown in FIG. 13, the variable resistance element VR in each memory cell MC is subjected to forming.

As shown in FIG. 13, the potential of the plate line PL2 is 0 V (ground potential). By contrast, the potentials of the other plate lines PL are Voff. The potential of the bit line BL2 is Voff. By contrast, the potentials of the other bit lines BL are 0 V (ground potential). The potential of the word line WL2 is +Vgoff. By contrast, the potentials of the other word lines WL are 0 V (ground potential).

In the selected memory cell MC22, the transistor TR1 is on. In other words, the voltage Vgoff of the word line WL2 (the word line WL to be coupled to the selected memory cell MC22) is a voltage at which the transistor TR1 in the selected memory cell MC22 turns on. More specifically, the voltage Vgoff is, for example, 2.5 V. By contrast, in each memory cell MC to be coupled to a word line WL other than the word line WL2 (the word line to be coupled to the selected memory cell MC22), the transistor TR1 is off.

The voltage Vgoff is higher than the earlier-mentioned voltage Vgon (FIG. 12). The reason is described below. The transistor operates in such a polarity that the drain is at a low potential and that the source is at a high potential. Thus, the gate-drain voltage is an effective gate voltage. However, in a state before the variable resistance element VR switches from the low-resistance state to the high-resistance state, a current flows to the cell so that the potential of the drain is increased by Vr. Therefore, the effective gate voltage is a value that is lower than a voltage applied to the word lines WL by Vr. Consequently, the gate voltage needs to be increased in order to compensate for such a voltage decrease.

In the selected memory cell MC22, the voltage between the plate line PL2 and the bit line BL2 is the difference between the potential (Voff) of the plate line PL2 and the potential (0 V (ground potential) of the bit line BL2, that is, Voff. The voltage Voff is, for example, approximately 2.5 V and lower than the aforementioned forming voltage Vform (for example, FIG. 6). When the potential of the plate line PL2 with respect to the bit line BL2 is −Voff, the variable resistance element VR switches from the low-resistance state (for example, approximately 10 kΩ) to the high-resistance state (for example, higher than 100 kΩ).

Referring to the example shown in FIG. 13, in each memory cell MC (except the selected memory cell MC22) coupled to the word line WL2, a current is prevented from flowing between the drain and the source. More specifically, in each of the above-described memory cells MC, the potential of the word line WL2 is Vgoff. In this instance, the transistor in each of the above-described memory cells MC is on. Meanwhile, in each of the above-described memory cells MC, the voltage between the plate lines PL and the bit line BL2 is the difference between the potential (Voff) of the plate lines PL and the potential (Voff) of the bit line BL2, that is, 0 V. Therefore, in each of the above-described memory cells MC, a current is prevented from flowing between the drain and the source. This suppresses the occurrence of disturbance (switching of the variable resistance element VR in a non-selected memory cell MC from the low-resistance state to the high-resistance state).

Further, referring to the example shown in FIG. 13, in each memory cell MC that differs from the selected memory cell MC22 in both the plate lines PL and the bit lines BL, the transistor TR1 does not break down between the drain and the source when the voltage between the plate lines PL and the bit lines BL is Voff.

More specifically, referring to the example shown in FIG. 13, in each of the above-described memory cells MC, the voltage between the plate lines PL and the bit lines BL is the difference between the potential (Voff) of the plate lines PL and the potential (0 V (ground potential) of the bit lines BL, that is, Voff. Further, in each of the above-described memory cells MC, the transistor TR1 is off. In this instance, the drain-source voltage Vds is substantially Voff. Let us assume a case where the drain-source withstand voltage is lower than Voff. In this case, in order to prevent the transistor TR1 in the above-described memory cells MC from breaking down, it is necessary that a voltage lower than Voff be applied to non-selected plate lines PL. In such an instance, in each memory cell (except the selected memory cell MC22) coupled to the word line WL2, a non-zero voltage is generated between the plate lines PL and the bit lines BL, and a high voltage is applied to the gate to turn on the transistor. In other words, a disturbance may occur as a voltage is applied to the variable resistance element VR in a non-selected memory cell MC in such a direction as to cause switching from the low-resistance state to the high-resistance state. By contrast, if the drain-source withstand voltage is higher than Voff in each of the above-described memory cells MC, the transistor TR1 in the above-described memory cells MC is prevented from breaking down between the drain and the source even if the voltage Voff is applied to non-selected plate lines PL. Therefore, the potential difference between both ends of each memory cell MC (except the selected memory cell MC22) coupled to the word line WL2 can be made zero. As a result, the above-mentioned disturbance is suppressed.

Figure 14:
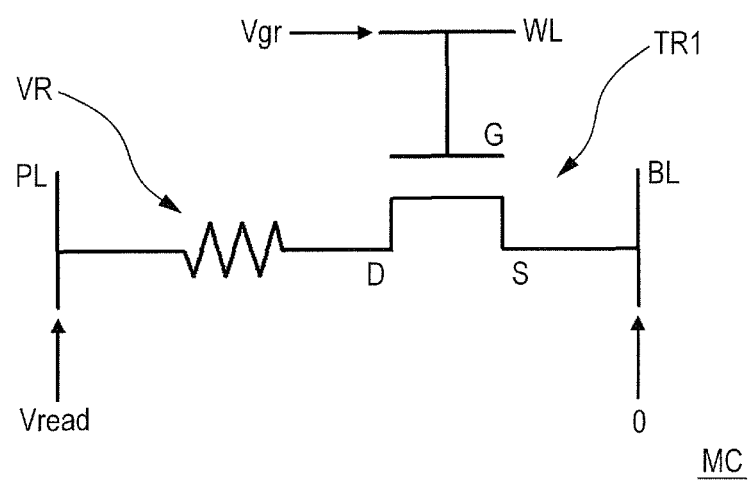
FIG. 14 is a diagram illustrating a first example of a read method according to the first embodiment.

FIG. 14 is a diagram illustrating a first example of a read method according to the present embodiment. The memory cell MC shown in FIG. 14 corresponds to one of the memory cells MC included in the memory cell array MCA shown in FIG. 2.

As shown in FIG. 14, a voltage Vgr is applied to a word line WL, a voltage Vread is applied to a plate line PL, and a bit line BL is grounded. In this instance, a current flowing in the plate line PL or the bit line BL is detected. Whether the variable resistance element VR is in the high-resistance state or in the low-resistance state is then determined in accordance with the result of current detection. The voltage Vgr is, for example, approximately 2.0 V. The voltage Vread is, for example, between 0.3 V and 0.5 V.

Figure 15:
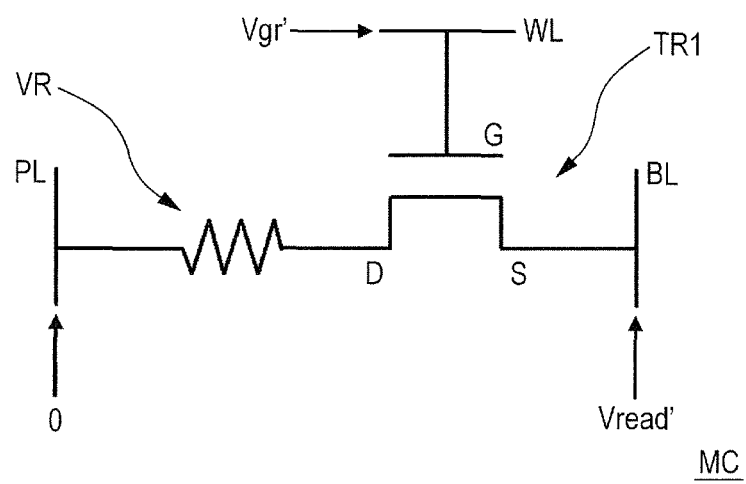
FIG. 15 is a diagram illustrating a second example of the read method according to the first embodiment.

FIG. 15 is a diagram illustrating a second example of the read method according to the present embodiment. The memory cell MC shown in FIG. 15 corresponds to one of the memory cells MC included in the memory cell array MCA shown in FIG. 2.

As shown in FIG. 15, a voltage Vgr' is applied to a word line WL, a voltage Vread' is applied to a bit line BL, and a plate line PL is grounded. In this instance, a current flowing in the plate line PL or the bit line BL is detected. Whether the variable resistance element VR is in the high-resistance state or in the low-resistance state is then determined in accordance with the result of current detection. The voltage Vgr' is, for example, approximately 2.5 V. The voltage Vread' is, for example, between 0.3 V and 0.5 V.

As described above, according to the present embodiment, the potential of a bit line BL is Vi in a memory cell MC (non-selected memory cell) to be coupled to the same plate line PL as for a memory cell MC subjected to forming. In a non-selected memory cell, therefore, the voltage between a plate line PL and a bit line BL can be relaxed. Further, in a non-selected memory cell, the potential of a word line WL is Vi'. Therefore, the voltage between a plate line PL and a word line WL can be relaxed in a non-selected memory cell. In this instance, the withstand voltage required for the transistor TR1 can be decreased. Consequently, the area of the transistor TR1 can be reduced.

Second Embodiment

Figure 16:
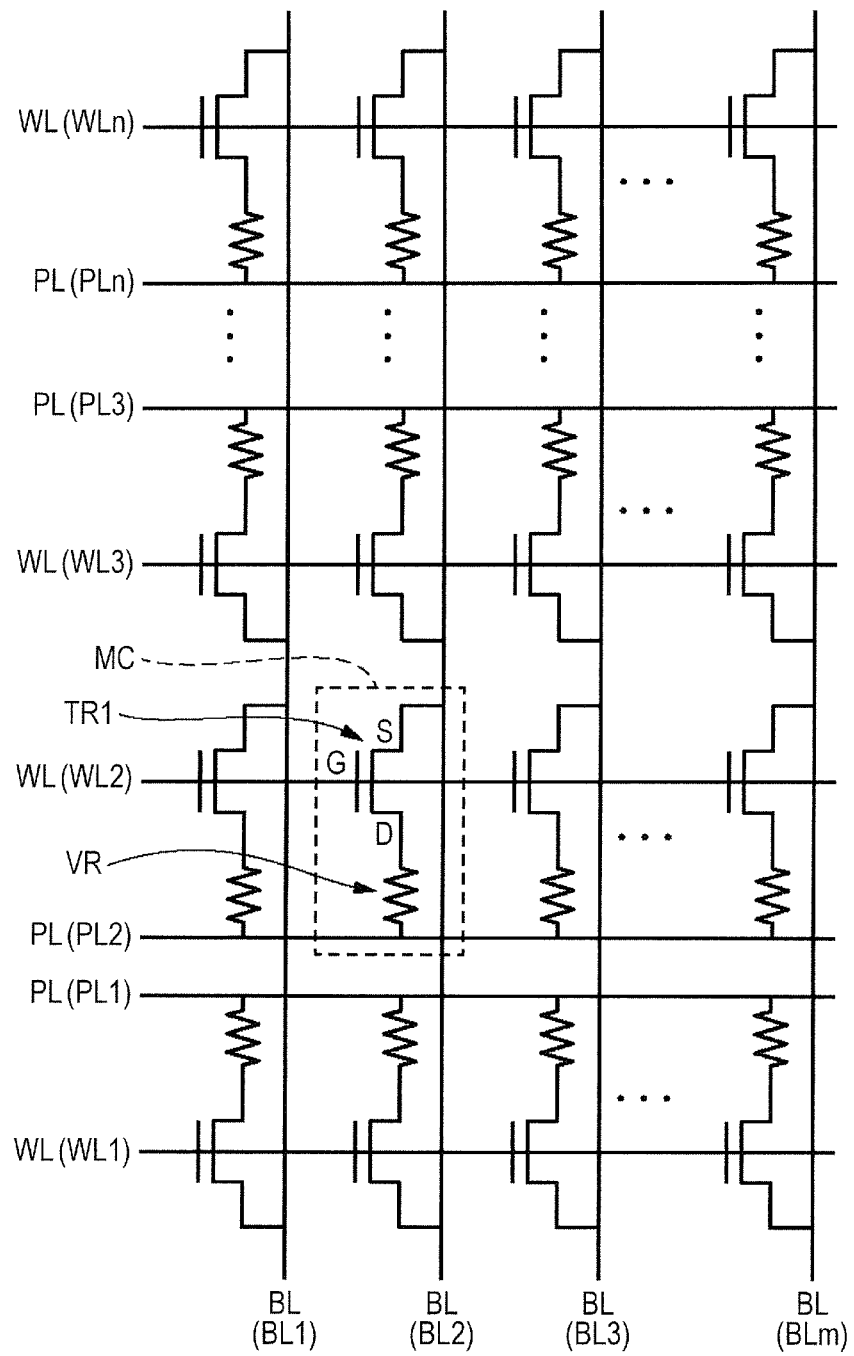
FIG. 16 is a circuit diagram illustrating a configuration of the memory cell array according to a second embodiment of the present invention.

FIG. 16 is a circuit diagram illustrating a configuration of the memory cell array MCA according to a second embodiment of the present invention, and corresponds to FIG. 2, which depicts the first embodiment. The memory cell array MCA according to the second embodiment is similar in configuration to the memory cell array MCA according to the first embodiment except as described below.

In the example shown in FIG. 16, the memory cell array MCA includes n (positive integer) plate lines PL (plate lines PL1, PL2, PL3, . . . , PLn) and m (positive integer) bit lines BL (bit lines BL1, BL2, BL3, . . . , BLm). Each memory cell is electrically coupled to one of the bit lines BL and one of the plate lines PL. The combination of bit line BL and plate line PL varies from one memory cell MC to another.

Further, in the example shown in FIG. 16, the memory cell array MCA includes n word lines WL (word lines WL1, WL2, WL3, . . . , WLn). The number of word lines WL is the same as the number of plate lines PL. Each word line WL is provided for a plurality of memory cells that are coupled to the same plate line PL. In this instance, each word line WL is coupled to the gate electrode (G) of each memory cell MC.

Figure 17:
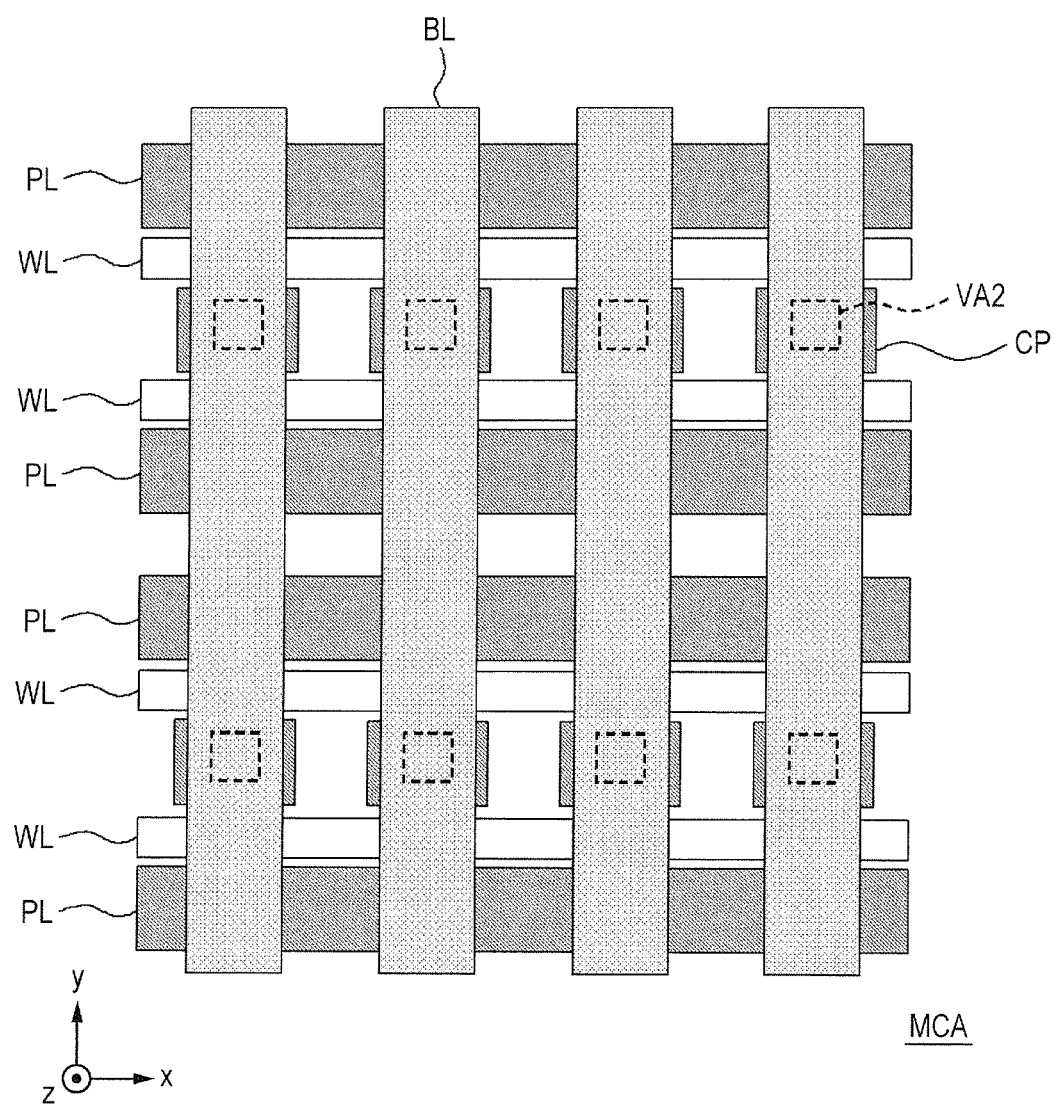
FIG. 17 is a plan view illustrating an exemplary configuration of the memory cell array shown in FIG. 16.
Figure 18:
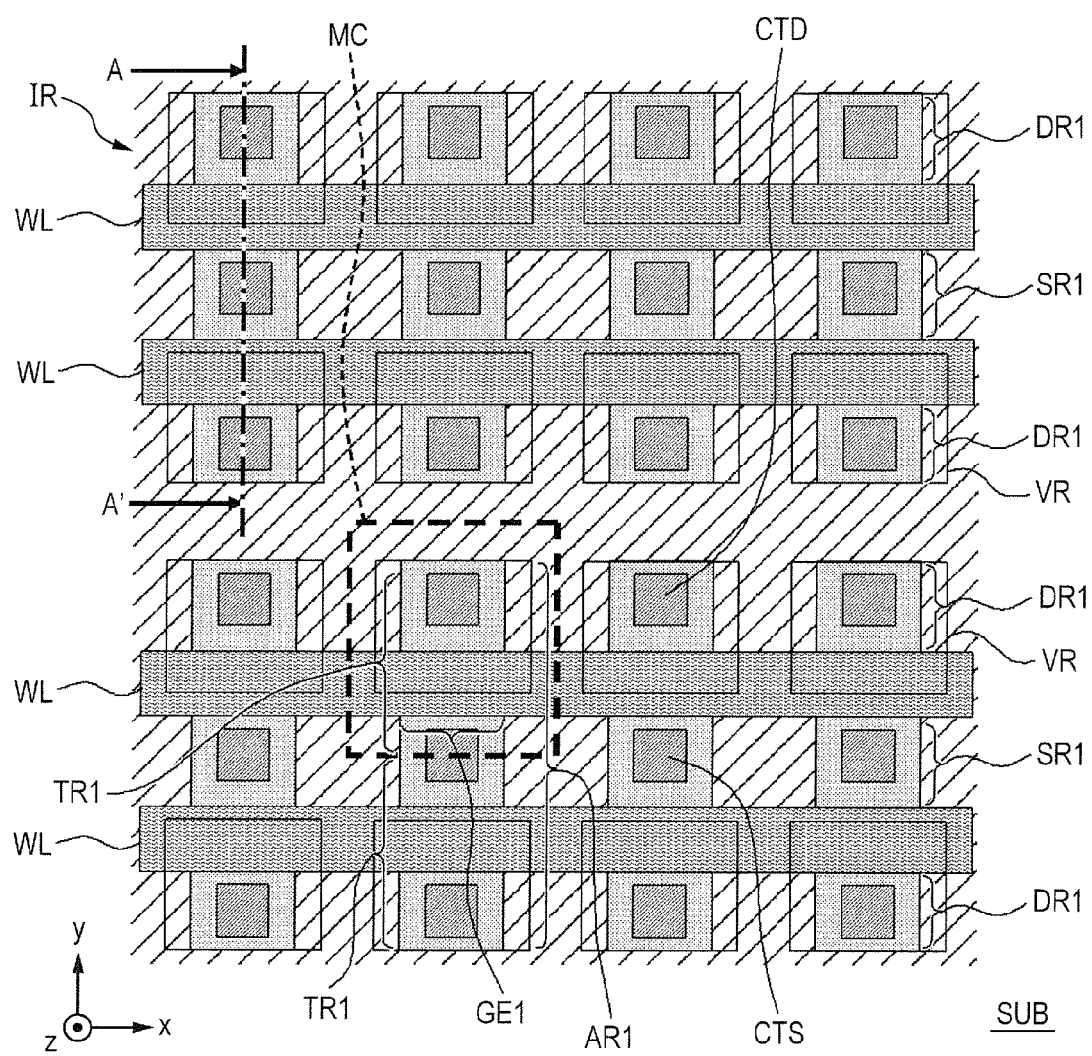
FIG. 18 is a diagram obtained when the bit lines, the plate lines, the conductor patterns, and the vias are removed from FIG. 17.
Figure 19:
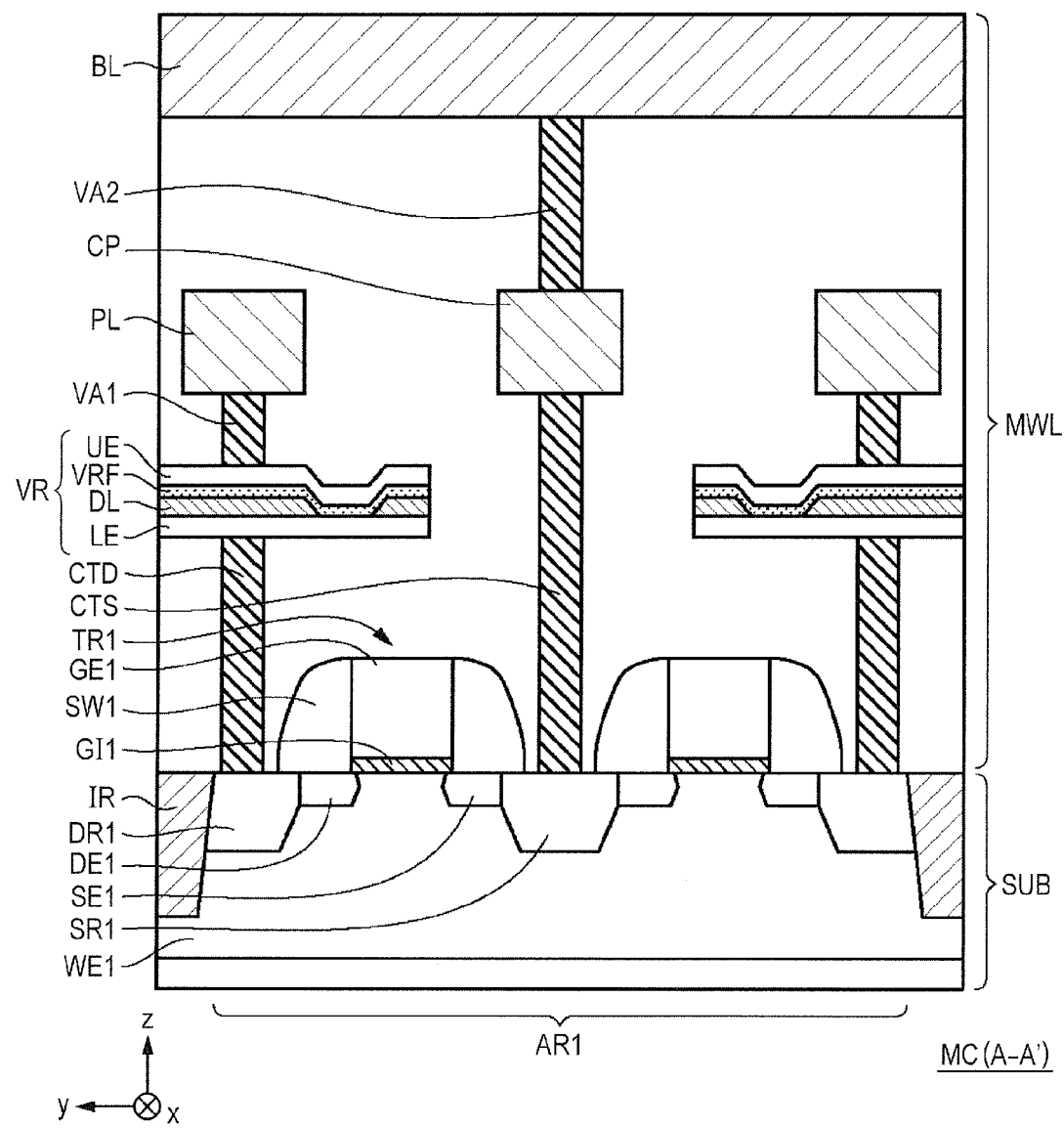
FIG. 19 is a cross-sectional view taken along line A-A' of FIG. 17.

FIG. 17 is a plan view illustrating an exemplary configuration of the memory cell array MCA shown in FIG. 16, and corresponds to FIG. 4, which depicts the first embodiment. FIG. 18 is a diagram obtained when the bit lines BL, the plate lines PL, the conductor patterns CP, and the via VA2 are removed from FIG. 17, and corresponds to FIG. 4, which depicts the first embodiment. FIG. 19 is a cross-sectional view taken along line A-A' of FIG. 17, and corresponds to FIG. 5, which depicts the first embodiment. The planar layout of the memory cell array MCA is not limited to the example shown in FIGS. 17 and 18. Similarly, the cross-section structure of the memory cells MC is not limited to the example shown in FIG. 19.

First of all, the planar layout of wirings (plate lines PL, bit lines BL, and word lines WL) included in the memory cell array MCA will be described with reference to FIG. 17. As shown in FIG. 17, the memory cell array MCA is configured so that the plate lines PL are disposed along the second direction (y-direction), and that the bit lines BL are disposed along the first direction (x-direction), and further that the word lines WL are disposed along the second direction (y-direction). Each plate line PL is extended in the first direction (x-direction). Each bit line BL is extended in the second direction (y-direction). Each word line WL is extended in the first direction (x-direction). Further, in the example shown in FIG. 17, a plate line PL, a word line WL, a word line WL, and a plate line PL are repeatedly disposed in the order named along the second direction (y-direction).

Each of the bit lines BL is provided with a plurality of conductor patterns CP. The conductor patterns CP are positioned in a layer beneath the bit lines BL. Further, each conductor pattern CP is provided with the via VA2. In the example shown in FIG. 17, a plate line PL, a word line WL, a conductor pattern CP, a word line WL, and a plate line PL are repeatedly disposed in the order named along the second direction (y-direction).

The planar layout of the memory cells MC will now be described with reference to FIG. 18. In the example shown in FIG. 18, a plurality of drain regions DR1 are disposed along the first direction (x-direction), and a plurality of source regions SR1 are disposed along the first region (x-direction). Further, a drain region DR1, a word line WL, a source region SR1, a word line WL, and a drain region DR1 are repeatedly disposed in the order named along the second direction (y-direction).

In the example shown in FIG. 18, two transistors TR1 are disposed in the second direction (y-direction) between drain regions DR1 that are adjacent to each other in the second direction (y-direction) through two word lines WL. These two transistors TR1 have the same source region SR1 between the above-mentioned two word lines WL. Consequently, the area of the memory cell array MCA can be reduced.

The cross-section structure of the memory cells MC will now be described with reference to FIG. 19. The cross-section structure according to the example shown in FIG. 19 is similar to the cross-section structure according to the example shown in FIG. 5 except as described below.

In the example shown in FIG. 19, one active region AR1 includes two transistors TR1. The transistors TR1 have the same source region SR1. The source region SR1 is coupled to a bit line BL through the contact CTS, the conductor pattern CP, and the via VA2. In this instance, separate source regions SR1 need not be provided for the two transistors TR1. Consequently, the area occupied by a plurality of transistors TR1 can be reduced.

Figure 20:
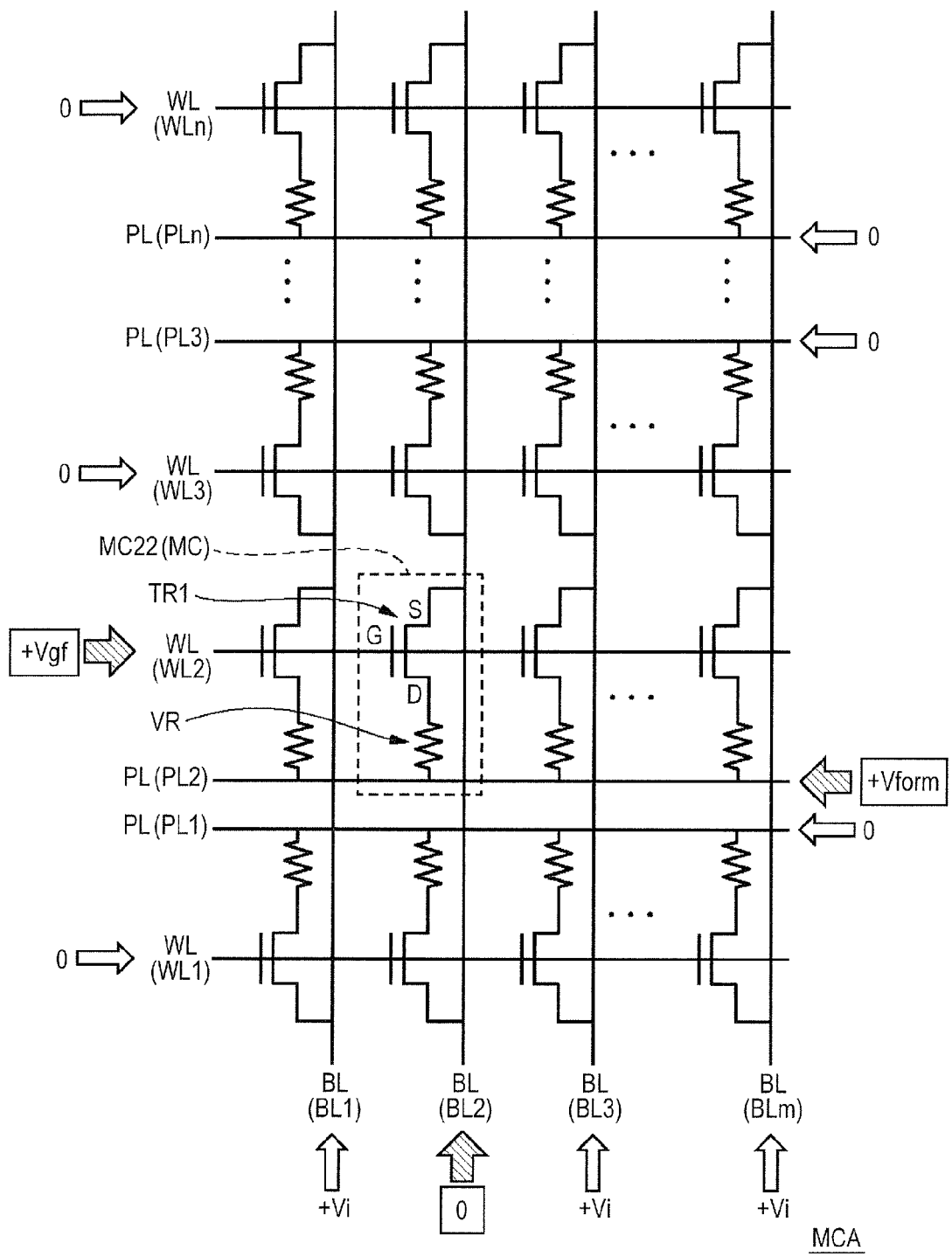
FIG. 20 is a diagram illustrating the forming method according to the second embodiment.

FIG. 20 is a diagram illustrating the forming method according to the second embodiment, and corresponds to FIG. 6, which depicts the first embodiment. In the example shown in FIG. 20, the variable resistance element VR of the selected memory cell MC22 (a memory cell MC enclosed by a broken line) is subjected to forming. The selected memory cell MC22 is coupled to the plate line PL2, the bit line BL2, and the word line WL2.

As shown in FIG. 20, the potential of the plate line PL2 is the forming voltage Vform. By contrast, the potentials of the other plate lines PL are 0 V (ground potential). The potential of the bit line BL2 is 0 V (ground potential). By contrast, the potentials of the other bit lines BL are +Vi. The potential of the word line WL2 is +Vgf. By contrast, the potentials of the other word lines WL are 0 V (ground potential).

In the selected memory cell MC22, the transistor TR1 is on. In other words, the voltage Vgf of the word line WL2 is a voltage at which the transistor TR1 in the selected memory cell MC22 turns on. More specifically, the voltage Vgf is, for example, 1.2 V.

In the selected memory cell MC22, the voltage between the plate line PL2 and the bit line BL2 is the difference between the potential (Vform) of the plate line PL2 and the potential of the bit line BL2, that is, the forming voltage Vform. The forming voltage Vform is a high voltage of 3 V or higher. When the potential of the plate line PL2 with respect to the bit line BL2 is +Vform, the variable resistance element VR is subjected to forming.

Referring to the example shown in FIG. 20, in each memory cell MC (except the selected memory cell MC22) coupled to the plate line PL2, the voltage between the plate line PL2 and the bit lines BL is the difference between the potential (Vform) of the plate line PL2 and the potential (Vi) of the bit lines BL, that is, equal to Vform−Vi. The potential Vi is higher than 0 V (ground potential) and lower than the potential Vform. More specifically, the potential Vi is, for example, 1.0 V. In this instance, the voltage between the plate line PL2 and the bit lines BL is lower than Vform. In other words, the voltage between the plate line PL2 and the bit lines BL is relaxed by the potentials Vi of bit lines BL other than the bit line BL2. Thus, the drain-source withstand voltage of the transistor TR1 can be decreased. In other words, the area of the transistor TR1 can be reduced.

Further, referring to the example shown in FIG. 20, in each memory cell MC (except the selected memory cell MC22) to be coupled to the plate line PL2, it is preferred that the transistor TR1 not turn on. More specifically, it is preferred that the potential Vi be higher than Vgf−Vth (Vi>Vgf−Vth). It should be noted that the voltage Vth is a threshold voltage for the transistor TR1. In each of the above-described memory cells MC, if Vi is higher than Vgf−Vth, the potentials of the word lines WL (gate electrode (G)) with respect to the bit lines BL (source (S)) are lower than Vth. Consequently, the transistor TR1 does not turn on in each of the above-described memory cells MC.

Figure 21:
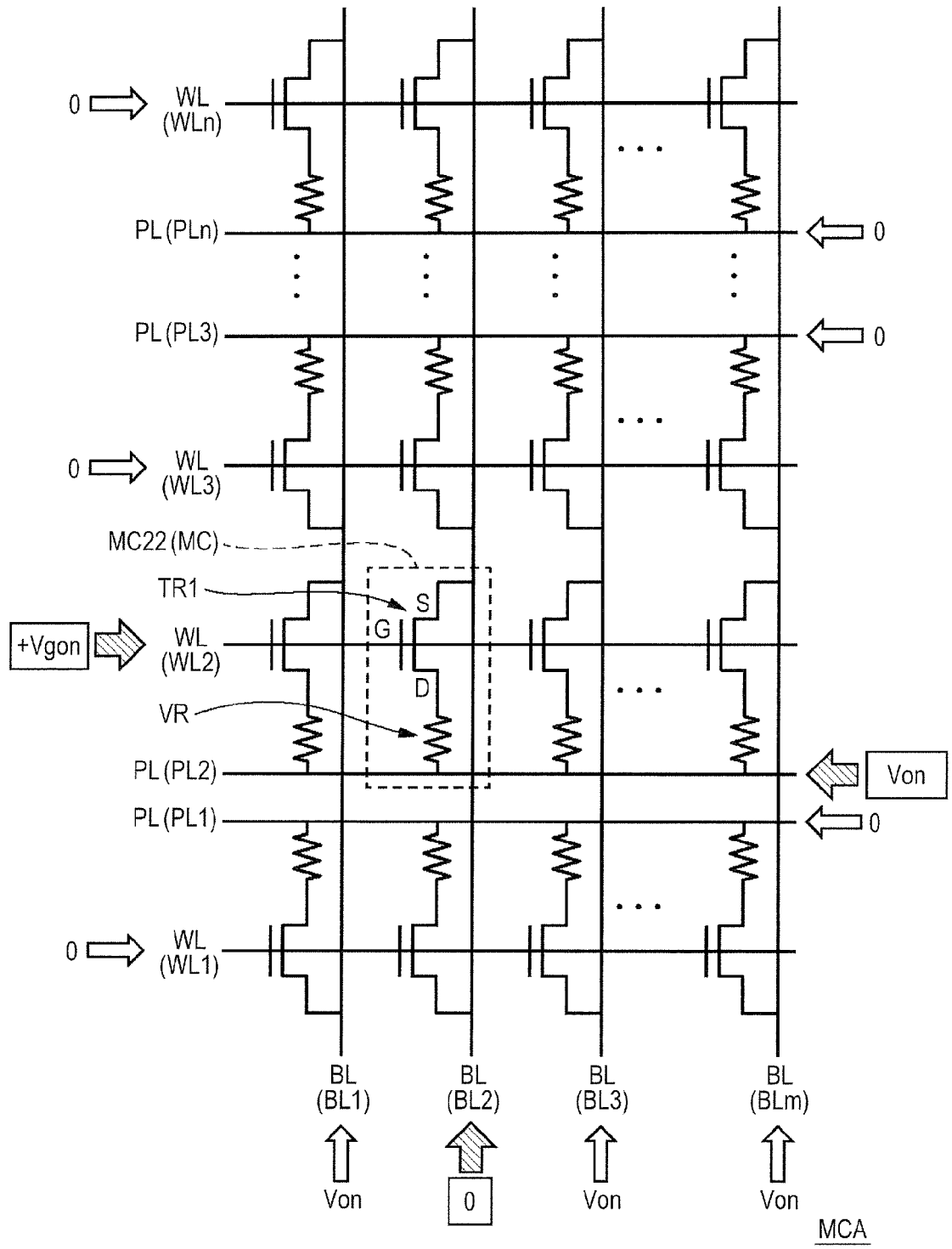
FIG. 21 is a diagram illustrating the first write method according to the second embodiment.

FIG. 21 is a diagram illustrating the first write method according to the second embodiment, and corresponds to FIG. 12, which depicts the first embodiment. In the example shown in FIG. 21, the variable resistance element VR of the selected memory cell MC22 (a memory cell MC enclosed by a broken line) switches from the high-resistance state to the low-resistance state. The selected memory cell MC22 is coupled to the plate line PL2, the bit line BL2, and the word line WL2. Further, in the example shown in FIG. 21, the variable resistance element VR in each memory cell MC is subjected to forming.

As shown in FIG. 21, the potential of the plate line PL2 is the voltage Von. By contrast, the potentials of the other plate lines PL are 0 V (ground potential). The potential of the bit line BL2 is 0 V (ground potential). By contrast, the potentials of the other bit lines BL are Von. The potential of the word line WL2 is +Vgon. By contrast, the potentials of the other word lines WL are 0 V (ground potential).

In the selected memory cell MC22, the transistor TR1 is on. In other words, the voltage Vgon of the word line WL2 (the word line WL to be coupled to the selected memory cell MC22) is a voltage at which the transistor TR1 in the selected memory cell MC22 turns on. More specifically, the voltage Vgon is, for example, 1.2 V. By contrast, in each memory cell MC to be coupled to a word line WL other than the word line WL2 (the word line to be coupled to the selected memory cell MC22), the transistor TR1 is off.

In the selected memory cell MC22, the voltage between the plate line PL2 and the bit line BL2 is the difference between the potential (Von) of the plate line PL2 and the potential (0 V (ground potential)) of the bit line BL2, that is, Von. The potential Von is, for example, approximately 2.5 V and lower than the above-mentioned forming voltage Vform (FIG. 20). When the potential of the plate line PL2 with respect to the bit line BL2 is +Von, the variable resistance element VR switches from the high-resistance state (for example, higher than 100 kΩ) to the low-resistance state (for example, approximately 10 kΩ).

Referring to the example shown in FIG. 21, in each memory cell MC (except the selected memory cell MC22) coupled to the word line WL2, a current is prevented from flowing between the drain and the source. More specifically, in each of the above-described memory cells MC, the potential of the word line WL2 is Vgon. In this instance, the transistor TR1 in each of the above-described memory cells MC is on. Meanwhile, in each of the above-described memory cells MC, the voltage between the plate line PL2 and the bit lines BL is the difference between the potential (Von) of the plate line PL2 and the potential (Von) of the bit lines BL, that is, 0 V. Therefore, in each of the above-described memory cells MC, a current is prevented from flowing between the drain and the source. This suppresses the occurrence of disturbance (switching of the variable resistance element VR in a non-selected memory cell MC from the high-resistance state to the low-resistance state).

Further, referring to the example shown in FIG. 21, in each memory cell MC that differs from the selected memory cell MC22 in both the plate lines PL and the bit lines BL, the transistor TR1 does not break down between the drain and the source when the voltage between the plate lines PL and the bit lines BL is Von.

More specifically, referring to the example shown in FIG. 21, in each of the above-described memory cells MC, the voltage between the plate lines PL and the bit lines BL is the difference between the potential (0 V (ground potential)) of the plate lines PL and the potential (Von) of the bit lines BL, that is, Von. Further, in each of the above-described memory cells MC, the transistor TR1 is off. In this instance, the drain-source voltage Vds is substantially Von. Let us assume a case where the drain-source withstand voltage is lower than Von. In this case, in order to prevent the transistor TR1 in the above-described memory cells MC from breaking down, it is necessary that a voltage lower than Von be applied to non-selected bit lines BL. In such an instance, in each memory cell (except the selected memory cell MC22) coupled to the word line WL2, a non-zero voltage is generated between the plate lines PL and the bit lines BL, and a high voltage is applied to the gate to turn on the transistor. In other words, a disturbance may occur as a voltage is applied to the variable resistance element VR in a non-selected memory cell MC in such a direction as to cause switching from the high-resistance state to the low-resistance state. By contrast, if the drain-source withstand voltage is higher than Von in each of the above-described memory cells MC, the transistor TR1 in the above-described memory cells MC is prevented from breaking down between the drain and the source even if the voltage Von is applied to non-selected bit lines BL. Therefore, the potential difference between both ends of each memory cell MC (except the selected memory cell MC22) coupled to the word line WL2 can be made zero. As a result, the above-mentioned disturbance is suppressed.

Figure 22:
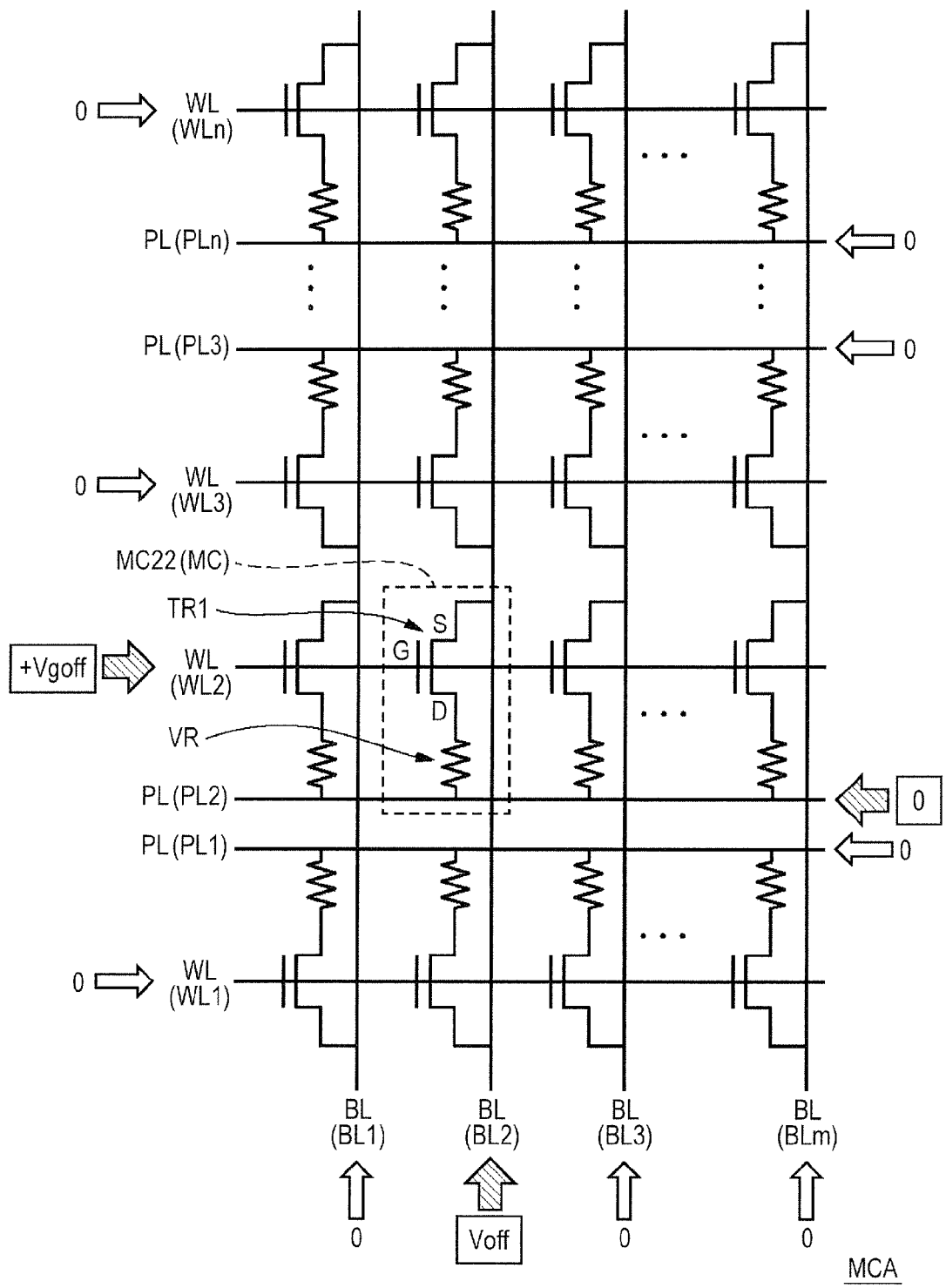
FIG. 22 is a diagram illustrating the second write method according to the second embodiment.

FIG. 22 is a diagram illustrating the second write method according to the second embodiment, and corresponds to FIG. 13, which depicts the first embodiment. In the example shown in FIG. 22, the variable resistance element VR of the selected memory cell MC22 (a memory cell MC enclosed by a broken line) switches from the low-resistance state to the high-resistance state. The selected memory cell MC22 is coupled to the plate line PL2, the bit line BL2, and the word line WL2. Further, in the example shown in FIG. 22, the variable resistance element VR in each memory cell MC is subjected to forming.

As shown in FIG. 22, the potential of the plate line PL2 is 0 V (ground potential). Similarly, the potentials of the other plate lines PL are also 0 V (ground potential). The potential of the bit line BL2 is Voff. By contrast, the potentials of the other bit lines BL are 0 V (ground potential). The potential of the word line WL2 is +Vgoff. By contrast, the potentials of the other word lines WL are 0 V (ground potential).

In the selected memory cell MC22, the transistor TR1 is on. In other words, the voltage Vgoff of the word line WL2 (the word line WL to be coupled to the selected memory cell MC22) is a voltage at which the transistor TR1 in the selected memory cell MC22 turns on. More specifically, the voltage Vgoff is, for example, 2.5 V. By contrast, in each memory cell MC to be coupled to a word line WL other than the word line WL2 (the word line to be coupled to the selected memory cell MC22), the transistor TR1 is off.

In the selected memory cell MC22, the voltage between the plate line PL2 and the bit line BL2 is the difference between the potential (0 V (ground potential)) of the plate line PL2 and the potential (Voff) of the bit line BL2, that is, Voff. The potential Voff is, for example, approximately 2.5 V and lower than the above-mentioned forming voltage Vform (FIG. 20). When the potential of the plate line PL2 with respect to the bit line BL2 is −Voff, the variable resistance element VR switches from the low-resistance state (for example, approximately 10 kΩ) to the high-resistance state (for example, higher than 100 kΩ).

Referring to the example shown in FIG. 22, in each memory cell MC (except the selected memory cell MC22) coupled to the bit line BL2, the transistor TR1 is prevented from breaking down between the drain and the source when the voltage between the plate lines PL and the bit line BL2 is Voff. This suppresses the occurrence of disturbance (switching of the variable resistance element VR in a non-selected memory cell MC from the low-resistance state to the high-resistance state).

More specifically, referring to the example shown in FIG. 22, in each of the above-described memory cells MC, the voltage between the plate lines PL and the bit line BL2 is the difference between the potential (0 V (ground potential)) of the plate lines PL and the potential (Voff) of the bit line BL2, that is, Voff. In this instance, the voltage Voff is divided into the voltage of the variable resistance element VR and the drain-source voltage. In each of the above-described memory cells MC, the drain-source withstand voltage is higher than the above-mentioned drain-source voltage (divided voltage). In this instance, the transistor TR1 in the above-described memory cells MC is prevented from breaking down between the drain and the source. As a result, the above-mentioned disturbance is suppressed.

The second embodiment provides the same advantageous effects as the first embodiment.

Third Embodiment

Figure 23:
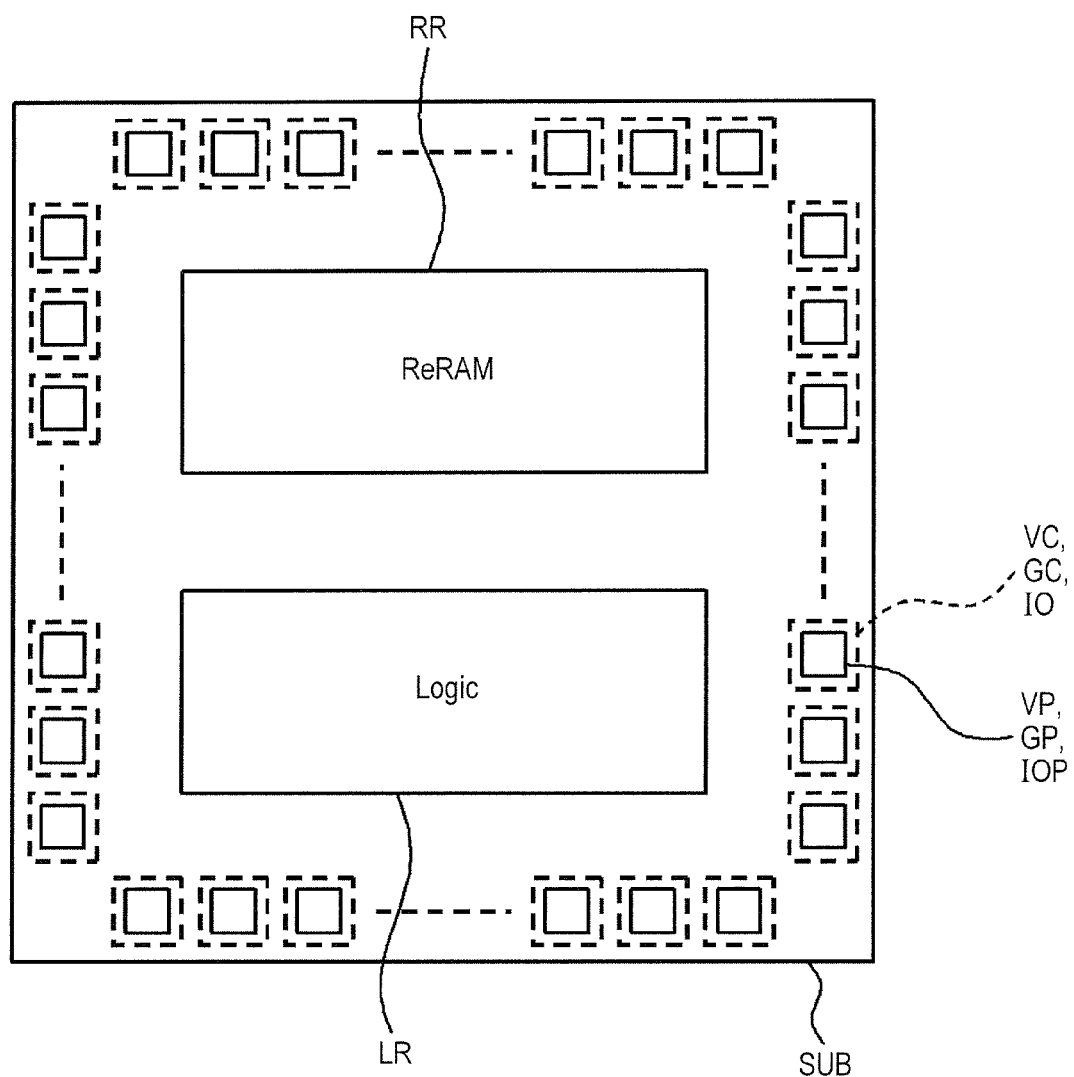
FIG. 23 is a plan view illustrating a configuration of the semiconductor device according to a third embodiment of the present invention.

FIG. 23 is a plan view illustrating a configuration of the semiconductor device according to a third embodiment of the present invention. The semiconductor device has a plurality of pads (a power supply pad VP, a ground pad GP, and an I/O pad IOP), a plurality of cells (a power supply cell VC, a ground cell GC, and an I/O cell IO), a ReRAM region RR, and a logic region LR over a substrate SUB. The I/O cell IO), the ReRAM region RR, and the logic region LR are configured in the same manner as in the semiconductor device (for example, FIG. 1) according to the first or second embodiment. The planar layout of the semiconductor device is not limited to the example shown in FIG. 23.

The substrate SUB is a semiconductor substrate (for example, a silicon substrate or a silicon-on-insulator (SOI) substrate). In the example shown in FIG. 23, the substrate SUB is rectangular in planar shape.

A plurality of pads are disposed along each rectangular side of the substrate. Each pad is the power supply pad VP, the ground pad GP, or the I/O pad IOP. The power supply pad VP is used to supply a power supply voltage to the semiconductor device. The ground pad GP is used to supply a ground potential to the semiconductor device. The I/O pad IOP is used to input a signal to the semiconductor device and output a signal from the semiconductor device.

A cell is electrically coupled to each pad. More specifically, the power supply cell VC is electrically coupled to the power supply pad VP. The ground cell GC is electrically coupled to the ground pad GP. The I/O cell IO is electrically coupled to the I/O pad IOP. In the example shown in FIG. 23, each cell is positioned below a pad that is coupled to the cell.

In the example shown in FIG. 23, each pad is rectangular in planar shape. Each cell is rectangular in planar shape and larger than a pad that is electrically coupled to the cell. In plan view, each pad is positioned inside a cell that is electrically coupled to the pad. However, the planar layout of each pad and of each cell is not limited to the example shown in FIG. 23.

Figure 24:
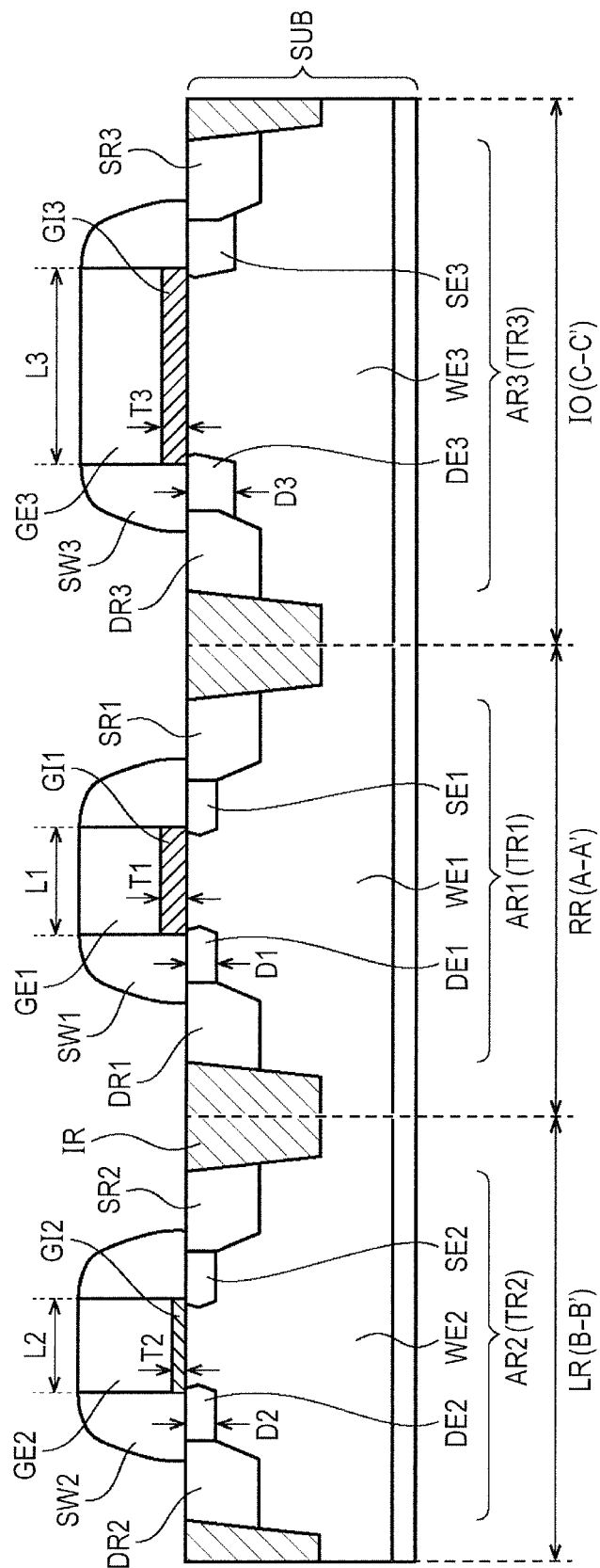
FIG. 24 is a cross-sectional view illustrating configurations of a transistor in a logic region, a transistor in a ReRAM region, and a transistor in an I/O cell.

FIG. 24 is a cross-sectional view illustrating configurations of a transistor TR2 in the logic region LR, a transistor TR1 in the ReRAM region RR, and a transistor TR3 in the I/O cell IO. The transistor TR1 configures the memory cell array MCA (memory circuit) (FIG. 1). The transistor TR2 configures the logic circuit LC (FIG. 2). The transistor TR3 configures the I/O cell IO (FIGS. 1 and 23). In the example shown in FIG. 24, the ReRAM region RR corresponds to cross-section A-A' of FIG. 25 (described later), the logic region LR corresponds to cross-section B-B' of FIG. 25, and the I/O cell IO corresponds to cross-section C-C' of FIG. 25.

The transistor TR1 shown in FIG. 24 corresponds to the transistor TR1 shown in FIG. 5 or 19. As is the case with the transistor TR1, the transistor TR2 includes a gate electrode GE2, a drain region DR2, a source region SR2, a gate insulating film GI2, a sidewall SW2, a drain extension region DE2, and a source extension region SE2. The transistor TR3 includes a gate electrode GE3, a drain region DR3, a source region SR3, a gate insulating film GI3, a sidewall SW3, a drain extension region DE3, and a source extension region SE3, as is the case with the transistor TR1.

The transistors TR1-TR3 are formed by using the same substrate SUB. As shown in FIG. 24, the substrate SUB has an active region AR1 in the ReRAM region RR, an active region AR2 in the logic region LR, and an active region AR3 in the I/O cell IO. In the active regions AR1, AR2, AR3, wells WE1, WE2, WE3 are formed respectively. The transistors TR1-TR3 are respectively formed by using the wells WE1-WE3. The transistors TR1-TR3 are electrically insulated from each other by an isolation region IR.

The transistors TR1-TR3 differ from each other in required withstand voltage. In the example shown in FIG. 24, the transistors TR1-TR3 differ from each other in structure due to different withstand voltage. Details are described below.

The withstand voltage required for the transistor TR3 (the transistor for the I/O cell IO) is higher than the withstand voltage required for the transistor TR2 (the transistor for the logic region LR). Therefore, the film thickness T3 of the gate insulating film GI3 is greater than the film thickness T2 of the gate insulating film GI2 (T3>T2). Further, the gate length L3 of the gate electrode GE3 is greater than the gate length L2 of the gate electrode GE2 (L3>L2). Besides, the drain extension region DE3 and the source extension region SE3 are deeper than the drain extension region DE2 and the source extension region SE2 (D3>D2).

As shown in FIG. 24, the film thickness T1 of the gate insulating film GI1 is greater than the film thickness T2 of the gate insulating film GI2 and equal to the film thickness T3 of the gate insulating film GI3 (T1=T3>T2). More specifically, the film thickness T1 of the gate insulating film GI1 is not greater than 8 nm in equivalent oxide thickness (EOT) and is preferably not greater than 6 nm in EOT.

As described with reference to FIGS. 12, 13, 21, and 22, it is necessary that the transistor TR1 not break down between the gate and the drain when the variable resistance element VR is written into. Thus, the film thickness of the gate insulating film GI1 is equal to the film thickness of the gate insulating film GI3.

As shown in FIG. 24, the gate length L1 of the gate electrode GE1 is greater than the gate length L2 of the gate electrode GE2 and smaller than the gate length L3 of the gate electrode GE3 (L2<L1<L3). More specifically, the gate length L1 of the gate electrode GE1 is not smaller than L2+5 nm and not greater than L2+20 nm.

As described with reference to FIGS. 12, 13, 21, and 22, it is necessary that the transistor TR1 not break down between the drain and the source when the variable resistance element VR is written into. Thus, the gate length L1 of the gate electrode GE1 is greater than the gate length L2 of the gate electrode GE2.

Further, as described with reference to FIGS. 6 and 20, in a memory cell MC (non-selected memory cell) to be coupled to the same plate line PL as the memory cell MC to be subjected to forming, the potentials of the bit lines BL are Vi. Thus, in a non-selected memory cell, the voltage between the plate lines PL and the bit lines BL can be relaxed. Consequently, the gate length L1 of the gate electrode GE1 can be made smaller than the gate length L3 of the gate electrode GE3.

As shown in FIG. 24, the drain extension region DE1 and the source extension region SE1 are equal in depth to the drain extension region DE2 and the source extension region SE2, and shallower than the drain extension region DE3 and the source extension region SE3 (D1=D2<D3). Further, the drain extension region DE1 and the source extension region SE1 are equal in impurity concentration to the drain extension region DE2 and the source extension region SE1.

The deeper the drain extension region (source extension region), the higher the withstand voltage of the transistor. Further, the lower the impurity concentration of the drain extension region (source extension region), the higher the withstand voltage of the transistor. In the example shown in FIG. 24, the transistor TR1 has a sufficiently high withstand voltage as compared to the transistor TR2 due to the configurations of the gate insulating films and gate electrodes, as described above. Consequently, the drain extension region DE1 and the source extension region SE1 can be configured in the same manner as the drain extension region DE2 and the source extension region SE2, as described above.

The drain extension region DE3 and the source extension region SE3 may be lower in impurity concentration than the drain extension regions DE1, DE2 and the source extension regions SE1, SE2, respectively. In such an instance, the withstand voltage of the transistor TR3 can be made higher than the withstand voltages of the transistors TR1, TR2.

Figure 25:
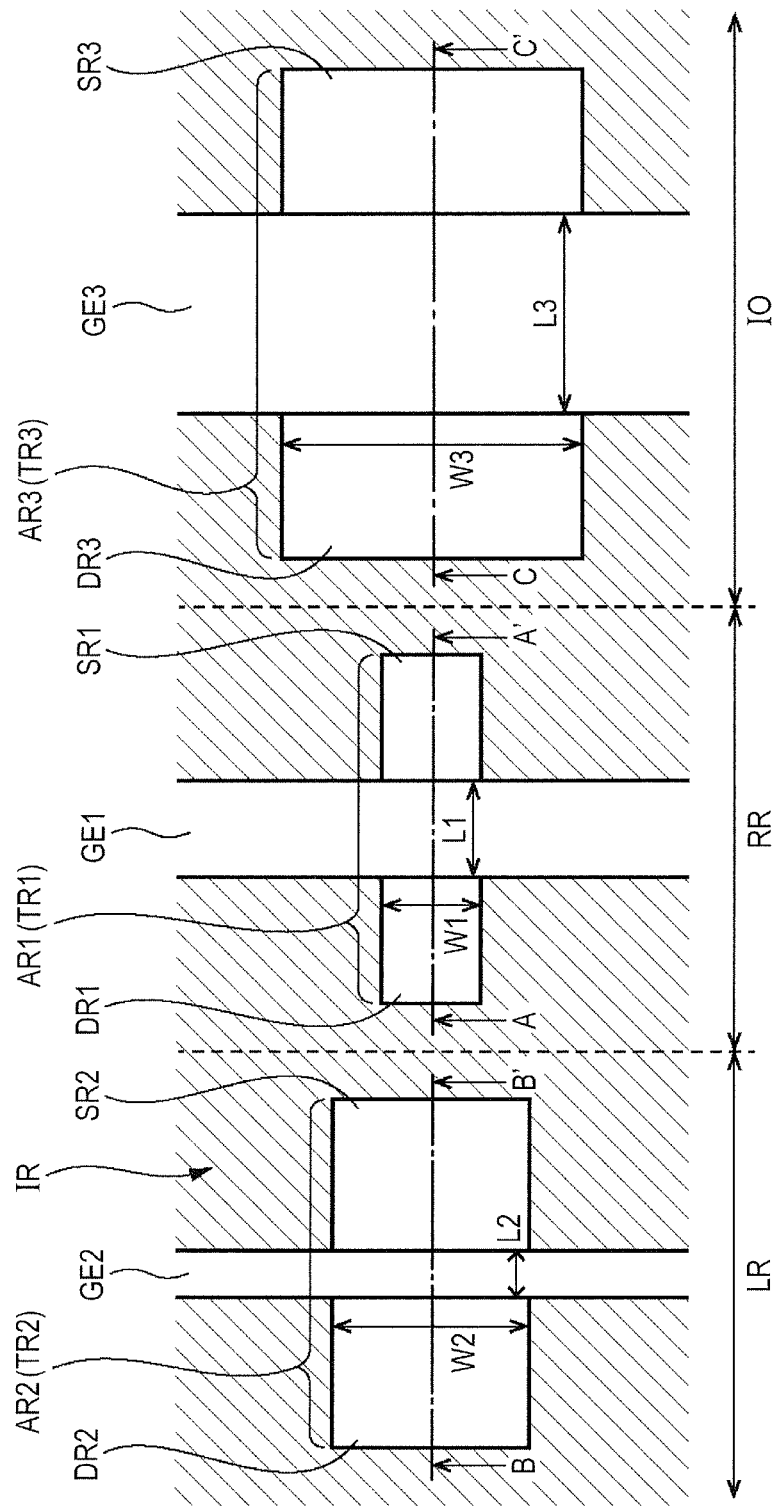
FIG. 25 is a plan view illustrating exemplary configurations of a transistor in the logic region, a transistor in the ReRAM region, and a transistor in the I/O cell.

FIG. 25 is a plan view illustrating exemplary configurations of the transistor TR2 in the logic region LR, the transistor TR1 in the ReRAM region RR, and the transistor TR3 in the I/O cell. In the example shown in FIG. 25, the gate width W1 of the gate electrode GE1 is smaller than the gate width W2 of the gate electrode GE2 and smaller than the gate width W3 of the gate electrode GE3 (W1<W2 and W1<W3). In the example shown in FIG. 25, the gate width W2 of the gate electrode GE2 is smaller than the gate width W3 of the gate electrode GE3 (W2<W3).

As described later with reference to FIG. 36, a higher gate voltage can be applied to the transistor TR1 than to the transistor TR2. Thus, the transistor TR1 provides a high current driving capability as described later. Consequently, the gate width W1 of the gate electrode GE1 can be made smaller than the gate width W2 of the gate electrode GE2.

Figure 26:
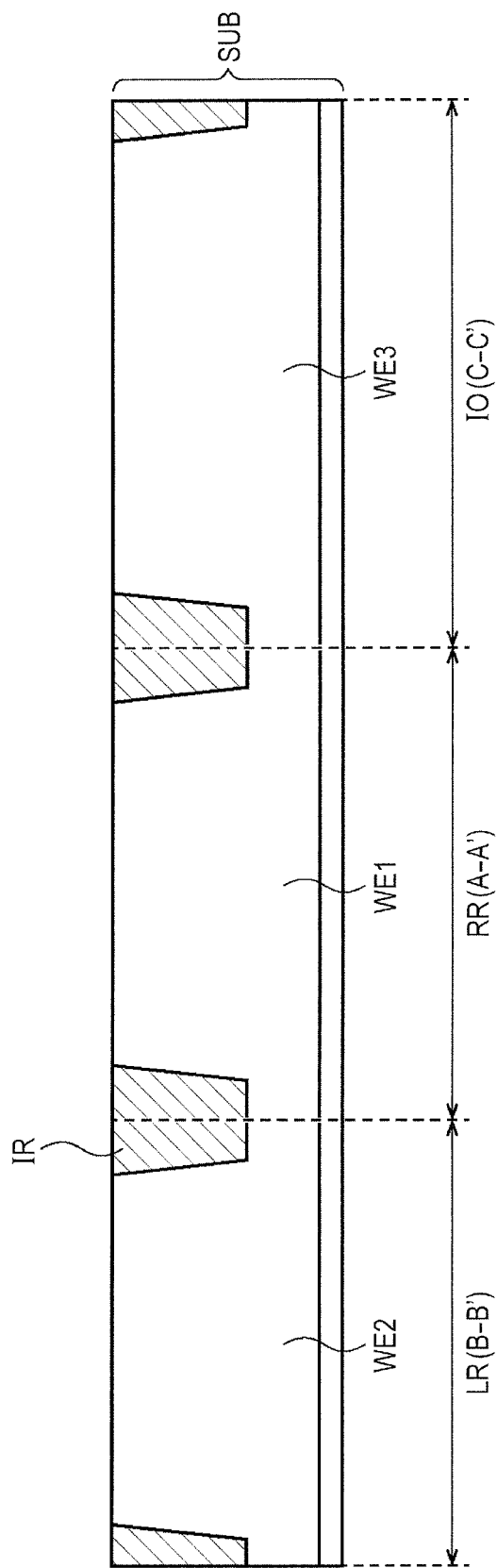
FIG. 26 is a cross-sectional view illustrating a method of manufacturing the semiconductor device shown in FIG. 24.

FIGS. 26 to 32 are cross-sectional views illustrating a method of manufacturing the semiconductor device shown in FIG. 24, and correspond to FIG. 24. First of all, as shown in FIG. 26, a p-type impurity (for example, boron (B)) is ion-injected into the substrate SUB. This forms wells WE1, WE2, WE3. Next, the isolation region IR is formed in the substrate SUB. The isolation region IR is formed, for instance, by STI or LOCOS.

Figure 27:
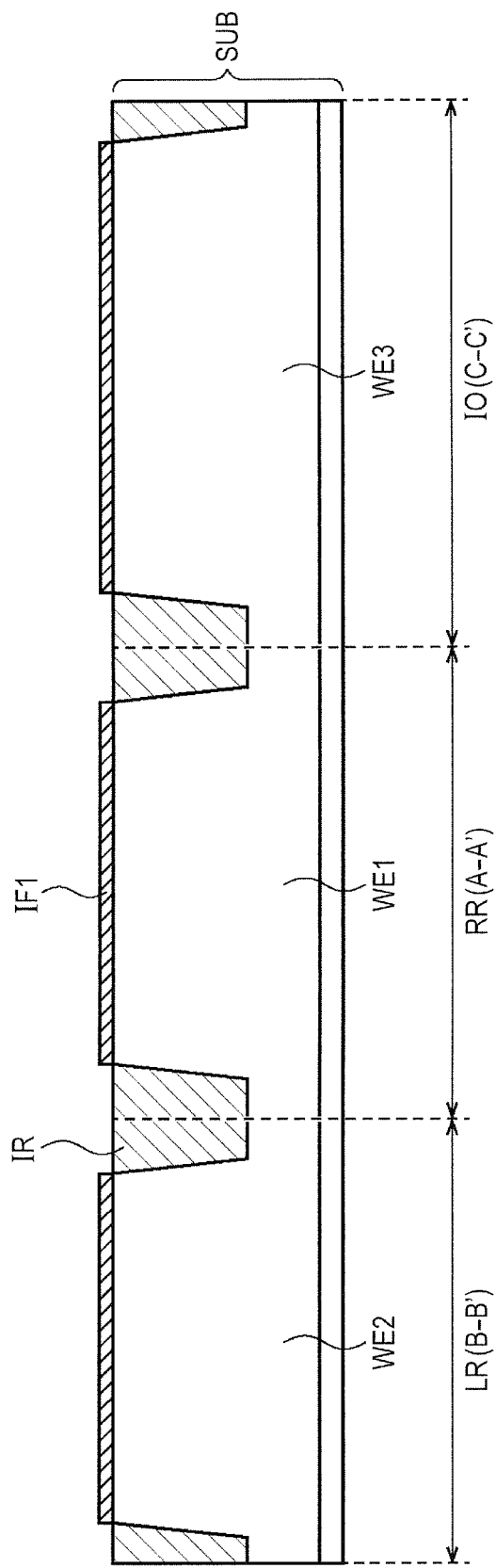
FIG. 27 is a cross-sectional view illustrating the method of manufacturing the semiconductor device shown in FIG. 24.

Next, as shown in FIG. 27, an insulating film IF1 is formed over the substrate SUB. The insulating film IF1 serves as the gate insulating films GI1, GI3 (FIG. 24). The insulating film IF1 is formed, for instance, by thermal oxidation.

Figure 28:
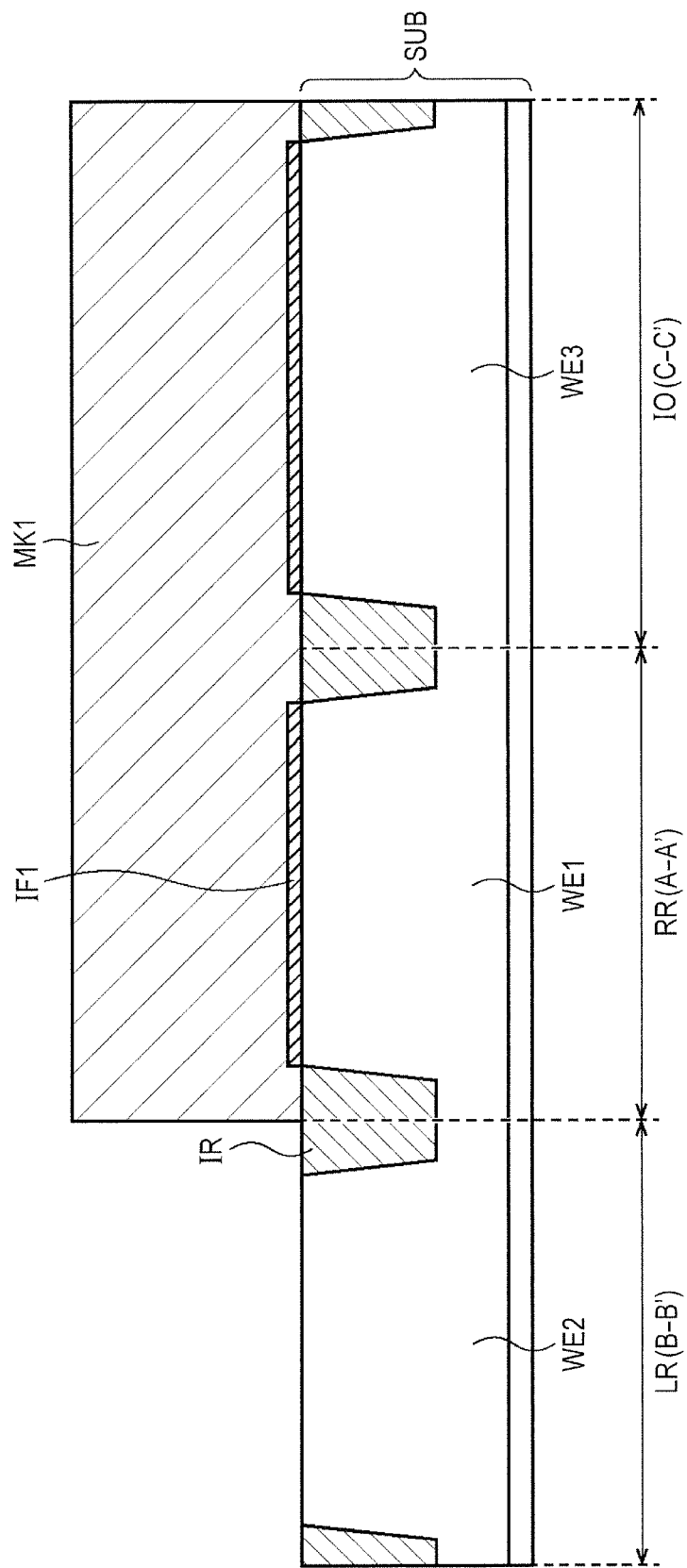
FIG. 28 is a cross-sectional view illustrating the method of manufacturing the semiconductor device shown in FIG. 24.

Next, as shown in FIG. 28, a mask film MK1 (for example, a resist pattern) is formed over the substrate SUB. The mask film MK1 covers the ReRAM region RR and the I/O cell IO, but does not cover the logic region LR. Next, the insulating film IF1 is etched by using the mask film MK1 as a mask. This removes the insulating film IF1 from the logic region LR.

Figure 29:
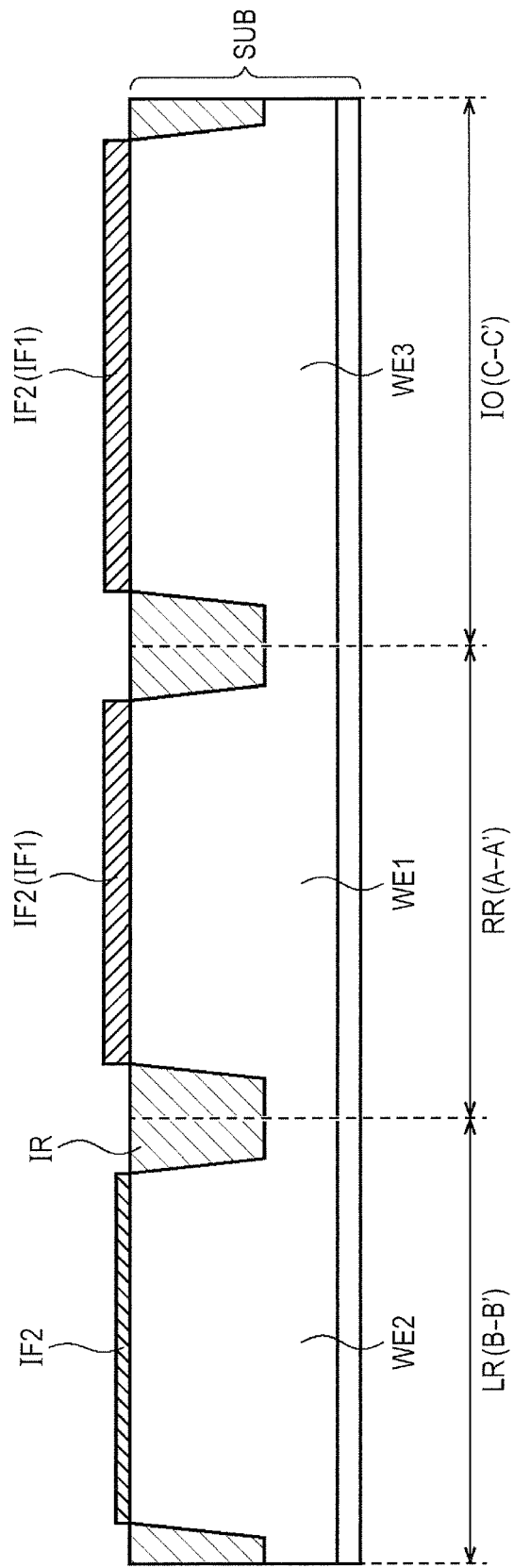
FIG. 29 is a cross-sectional view illustrating the method of manufacturing the semiconductor device shown in FIG. 24.

Next, as shown in FIG. 29, the mask film MK1 (FIG. 28) is removed. The mask film MK1 is removed, for instance, by ashing. Next, an insulating film IF2 is formed over the substrate SUB. This forms the insulating film IF2 (insulating film IF1) over the ReRAM region RR and the I/O cell IO. The insulating film IF2 (insulating film IF1) formed over the ReRAM region RR is equal in film thickness to the insulating film IF2 (insulating film IF1) formed over the I/O cell IO. By contrast, the insulating film IF2 smaller in film thickness than the insulating film IF2 formed over the ReRAM region RR and the I/O cell IO is formed over the logic region LR. The insulating film IF2 serves as the gate insulating films GI1, GI2, GI3 (FIG. 24). The insulating film IF2 is formed, for instance, by thermal oxidation. Next, a conductive film (for example, a polysilicon film) (not shown) is formed over the substrate SUB. The conductive film serves as the gate electrodes GE1, GE2, GE3.

Figure 30:
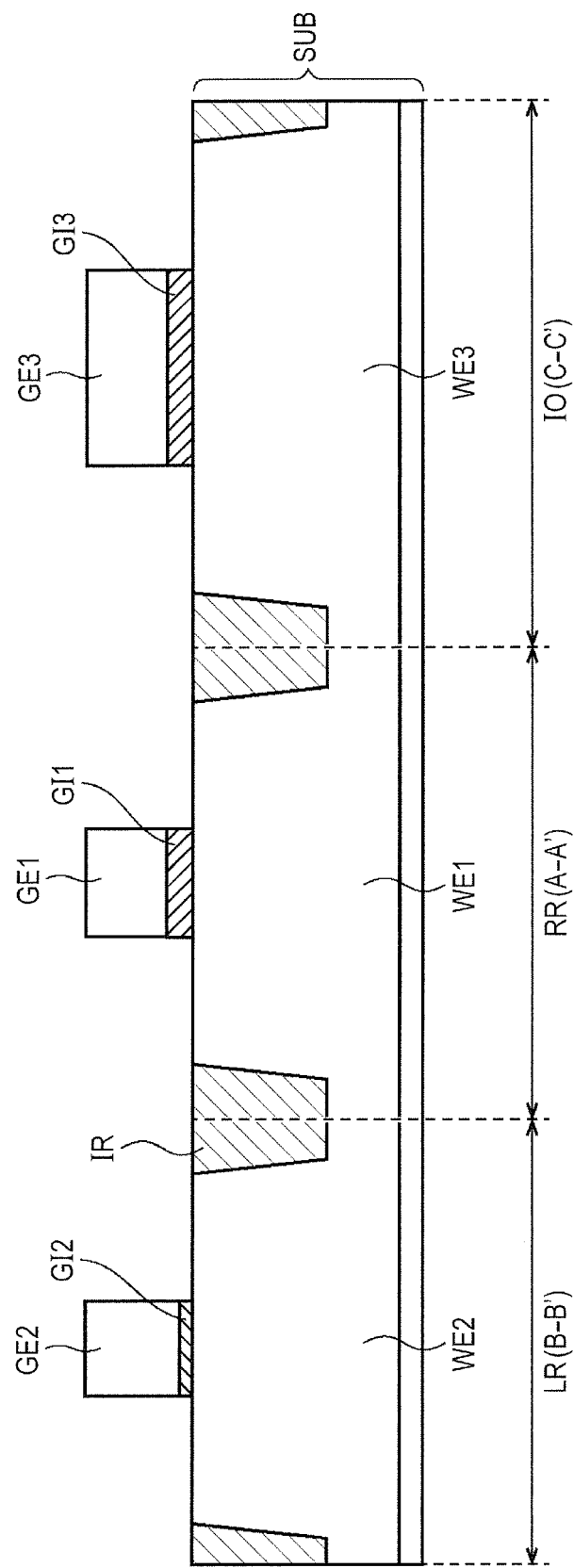
FIG. 30 is a cross-sectional view illustrating the method of manufacturing the semiconductor device shown in FIG. 24.

Next, as shown in FIG. 30, the aforementioned conductive film and insulating film IF2 are patterned. This not only forms the gate electrodes GE1, GE2, GE3, but also forms the gate insulating films GI1, GI2, GI3.

Figure 31:
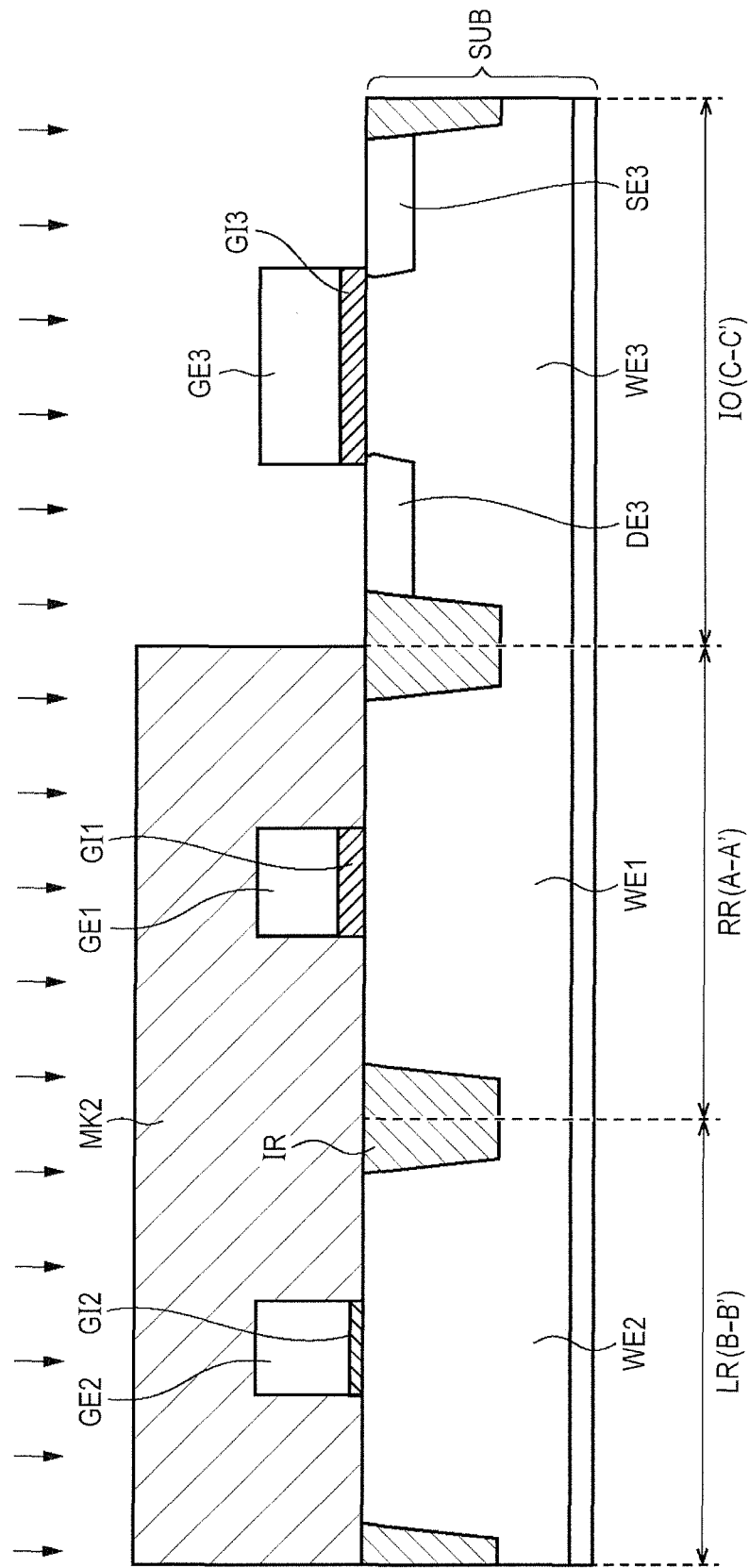
FIG. 31 is a cross-sectional view illustrating the method of manufacturing the semiconductor device shown in FIG. 24.

Next, as shown in FIG. 31, a mask film MK2 (for example, a resist pattern) is formed over the substrate SUB. The mask film MK2 covers the logic region LR and the ReRAM region RR, but does not cover the I/O cell IO. Next, an n-type impurity (for example, phosphorus (P)) is ion-injected into the substrate SUB by using the mask film MK2, the gate electrode GE3, and the isolation region IR as a mask. This forms the drain extension region DE3 and the source extension region SE3.

Figure 32:
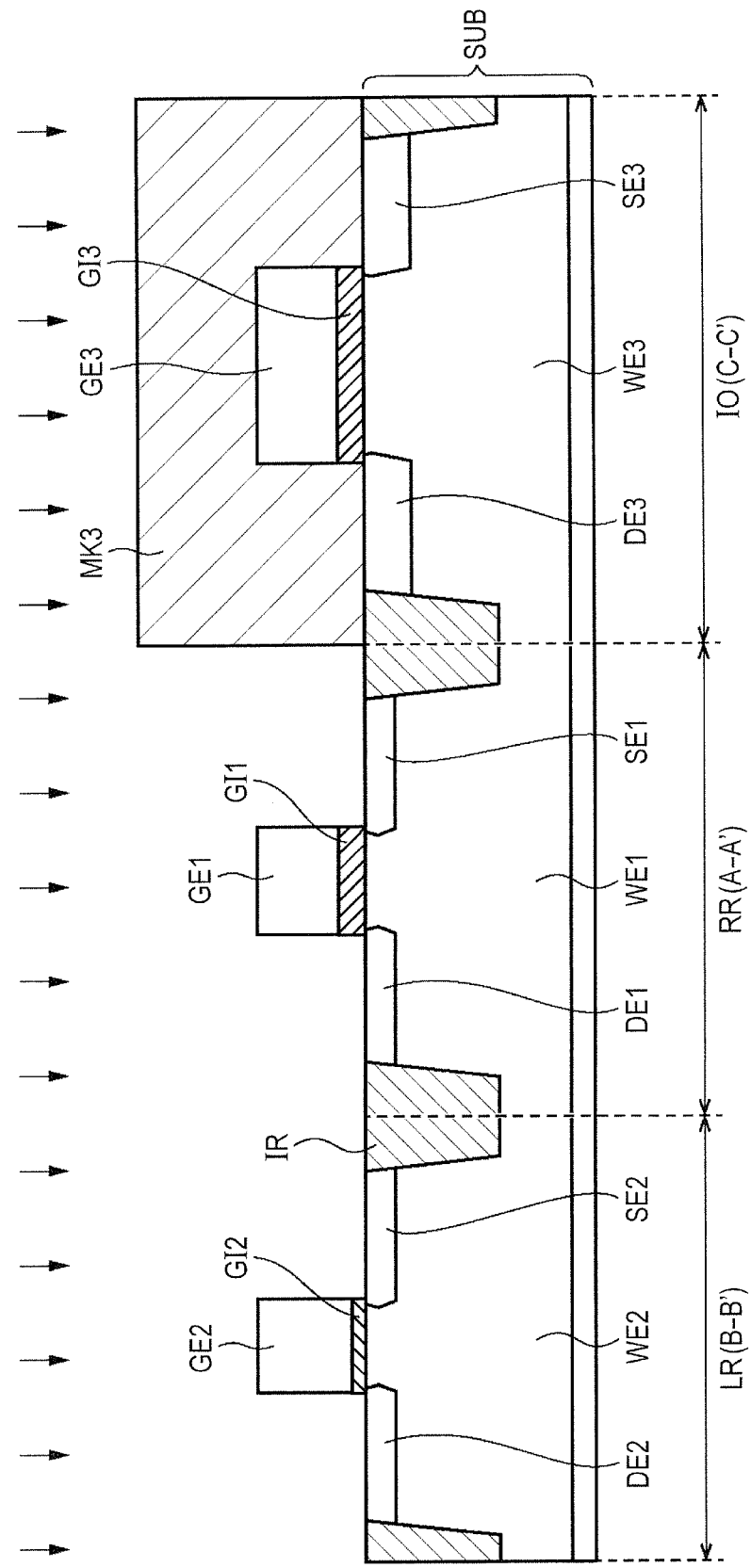
FIG. 32 is a cross-sectional view illustrating the method of manufacturing the semiconductor device shown in FIG. 24.

Next, as shown in FIG. 32, the mask film MK2 (FIG. 31) is removed. The mask film MK2 is removed, for instance, by ashing. Next, a mask film MK3 (for example, a resist pattern) is formed over the substrate SUB. The mask film MK3 covers the I/O cell IO, but does not cover the logic region LR or the ReRAM region RR. Next, an n-type impurity (for example, phosphorus (P)) is ion-injected into the substrate SUB by using the mask film MK3, the gate electrodes GE1, GE2, and the isolation region IR as a mask. This forms the drain extension regions DE1, DE2 and the source extension regions SE1, SE2.

Next, the mask film MK3 is removed. The mask film MK3 is removed, for instance, by ashing. Next, an insulating film that serves as the sidewalls SW1, SW2, SW3 is formed over the substrate SUB. Next, the insulating film is etched back. This forms the sidewalls SW1, SW2, SW3. Next, an n-type impurity (for example, phosphorus (P)) is ion-injected into the substrate SUB by using the gate electrodes GE1, GE2, GE3, the sidewalls SW1, SW2, SW3, and the isolation region IR as a mask. This forms the drain regions DR1, DR2, DR3 and the source regions SR1, SR2, SR3. The semiconductor device shown in FIG. 24 is manufactured in the above-described manner.

Figure 33:
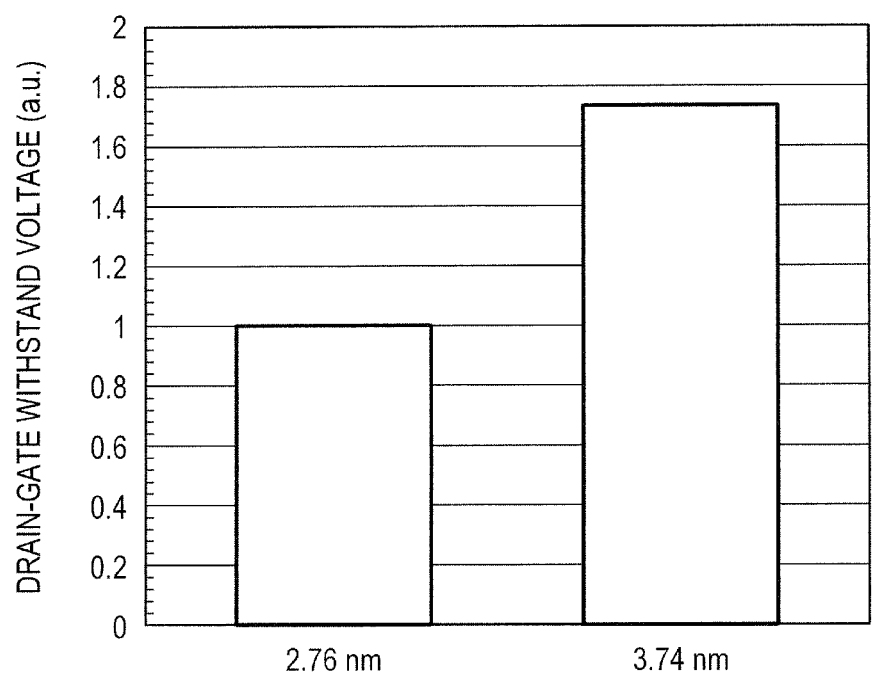
FIG. 33 is a diagram illustrating the result of simulation of the gate-drain withstand voltage of a transistor.

FIG. 33 is a diagram illustrating the result of simulation of the gate-drain withstand voltage of the transistor TR1. FIG. 33 shows the result obtained when the film thickness of the gate insulating film GI1 is 2.76 nm in EOT and the result obtained when the film thickness of the gate insulating film GI1 is 3.74 nm in EOT.

As shown in FIG. 33, the gate-drain withstand voltage is higher when the film thickness of the gate insulating film GI1 is 3.74 nm in EOT than when it is 2.76 nm in EOT. This indicates that the gate-drain withstand voltage increases when the film thickness of the gate insulating film GI1 is increased.

Figure 34:
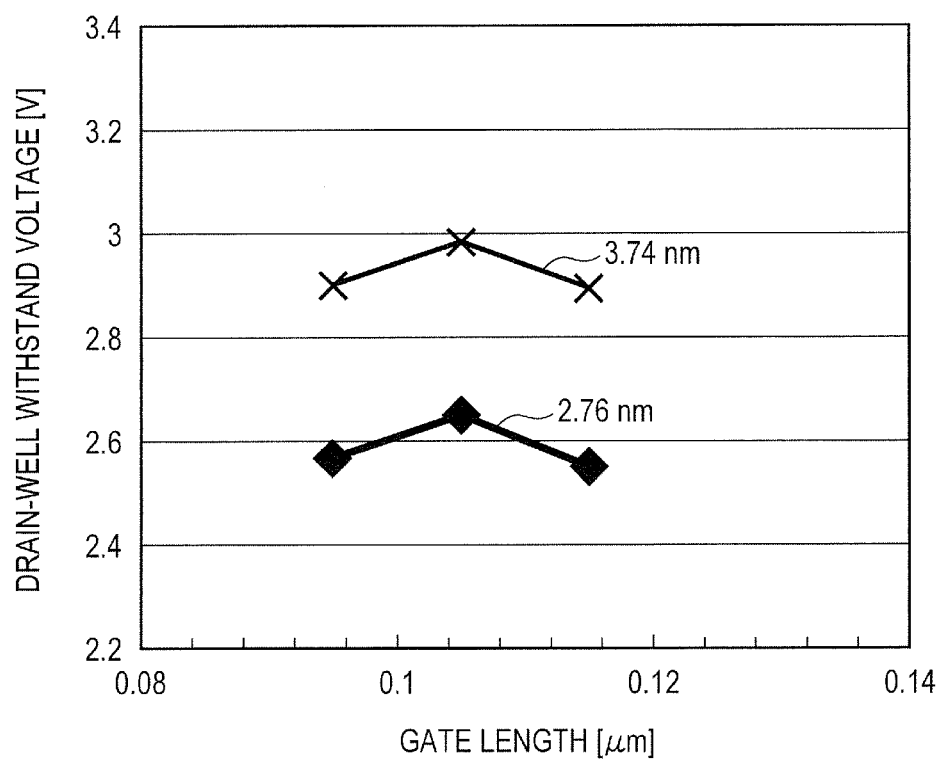
FIG. 34 is a diagram illustrating the result of simulation of the drain-well withstand voltage of the transistor.

FIG. 34 is a diagram illustrating the result of simulation of the drain-well withstand voltage of the transistor TR1. As is the case with FIG. 33, FIG. 34 shows the result obtained when the film thickness of the gate insulating film GI1 is 2.76 nm in EOT and the result obtained when the film thickness of the gate insulating film GI1 is 3.74 nm in EOT.

As shown in FIG. 34, when the film thickness of the gate insulating film GI1 is 3.74 nm in EOT, the drain-well withstand voltage is higher by approximately 0.3 V than when it is 2.76 nm in EOT no matter what the gate length is.

This result indicates that the electric field between the drain and the well relaxes when the film thickness of the gate insulating film GI1 is increased.

Figure 35A:
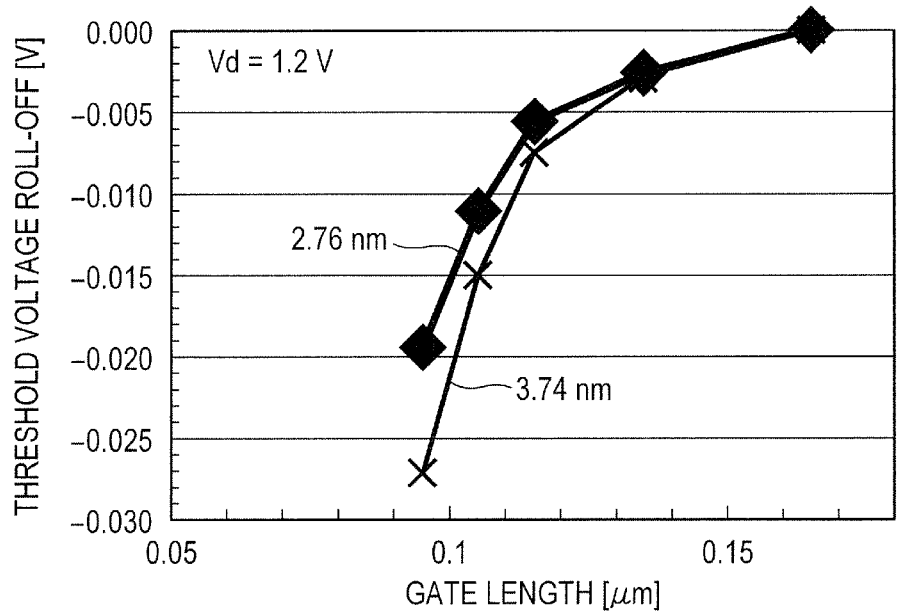
FIG. 35A is a diagram illustrating the result of simulation of threshold voltage roll-off of the transistor.
Figure 35B:
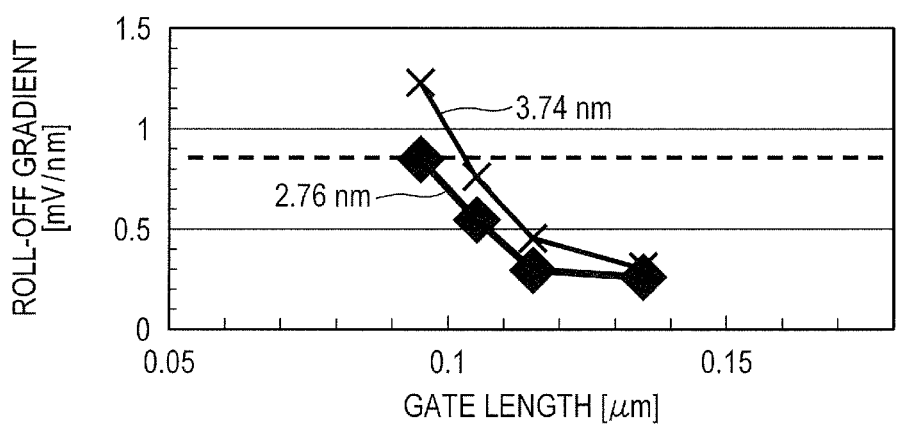
FIG. 35B is a diagram illustrating a roll-off gradient derived from FIG. 35A.

FIG. 35A is a diagram illustrating the result of simulation of threshold voltage roll-off of the transistor TR1. FIG. 35B is a diagram illustrating a roll-off gradient derived from FIG. 35A. As is the case with FIG. 33, FIGS. 35A and 35B each show the result obtained when the film thickness of the gate insulating film GI1 is 2.76 nm in EOT and the result obtained when the film thickness of the gate insulating film GI1 is 3.74 nm in EOT. In the example shown in FIG. 35A, a drain voltage Vd is 1.2 V.

As shown in FIG. 35A, the threshold voltage of the transistor TR1 varies depending on the gate length. More specifically, in the example shown in FIG. 35A, the smaller the gate length, the lower the threshold voltage of the transistor TR1. This is caused by a short-channel effect. The decrease in the threshold voltage is greater when the film thickness of the gate insulating film GI1 is 3.74 nm in EOT than when it is 2.76 nm in EOT no matter what the gate length is.

Meanwhile, as shown in FIG. 35B, the roll-off gradient resulting when the film thickness of the gate insulating film GI1 is 3.74 nm in EOT is equal to or smaller than the roll-off gradient resulting when the film thickness of the gate insulating film GI1 is 2.76 nm in EOT in a situation where the gate length is greater by approximately 10 nm than when the film thickness of the gate insulating film GI1 is 2.76 nm in EOT. This result indicates that even if the film thickness of the gate insulating film GI1 is 3.74 nm in EOT, the short-channel effect can be suppressed to the same extent as when the film thickness of the gate insulating film GI1 is 2.76 nm in EOT as far as the gate length is increased by 10 nm or more.

Figure 36:
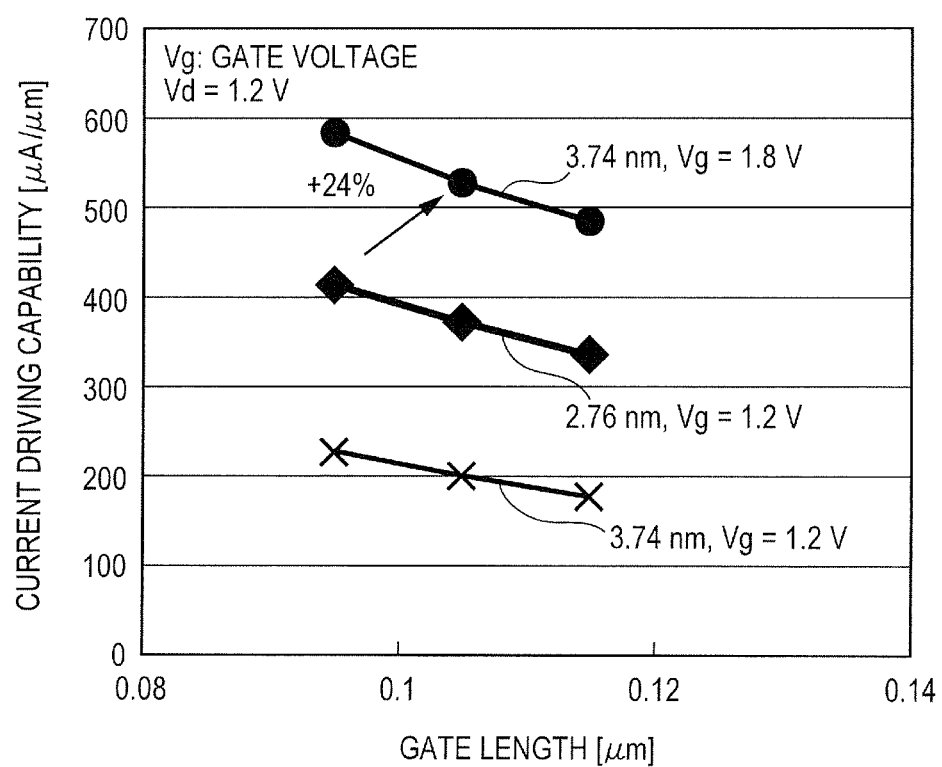
FIG. 36 is a diagram illustrating the result of simulation of the current driving capability of the transistor.

FIG. 36 is a diagram illustrating the result of simulation of the current driving capability of the transistor TR1. As is the case with FIG. 33, FIG. 36 shows the result obtained when the film thickness of the gate insulating film GI1 is 2.76 nm in EOT and the result obtained when the film thickness of the gate insulating film GI1 is 3.74 nm in EOT. In the example shown in FIG. 36, the drain voltage Vd is 1.2 V.

As shown in FIG. 36, the current driving capability obtained when a gate voltage Vg is 1.2 V is lower when the film thickness of the gate insulating film GI1 is 3.74 nm in EOT than when it is 2.76 nm in EOT no matter what the gate length is. Meanwhile, as shown in FIG. 36, the current driving capability obtained when the film thickness of the gate insulating film GI1 is 3.74 nm in EOT and the gate voltage Vg is 1.8 V is higher by 24% than when the film thickness of the gate insulating film GI1 is 2.76 nm in EOT and the gate voltage Vg is 1.2 V.

The above-described result indicates that the current driving capability can be supplemented by increasing the gate voltage when the film thickness of the gate insulating film GI1 is 3.74 nm in EOT. As shown in FIG. 33, when the film thickness of the gate insulating film GI1 is 3.74 nm in EOT, the gate-drain withstand voltage is higher than when the film thickness of the gate insulating film GI1 is 2.76 nm in EOT. Therefore, when the film thickness of the gate insulating film GI1 is 3.74 nm in EOT, a higher gate voltage can be used than when the film thickness of the gate insulating film GI1 is 2.76 nm in EOT.

Further, the above-described result indicates that when the film thickness of the gate insulating film GI1 is 3.74 nm in EOT, the gate width can be decreased by increasing the gate voltage. More specifically, for example, the gate width of the transistor TR1 can be made smaller than the gate width of the transistor TR2 and the gate width of the transistor TR3. As described above, when the film thickness of the gate insulating film GI1 is 3.74 nm in EOT, the current driving capability is supplemented by increasing the gate voltage. In this instance, when the current driving capability is supplemented by increasing the gate voltage, a necessary current value can be obtained even if the gate width is decreased.

As described above, according to the present embodiment, the transistor TR1, the transistor TR2, and the transistor TR3 are included in the ReRAM region RR, the logic region LR, and the I/O cell IO, respectively. The film thickness of the gate insulating film GI1 is greater than the film thickness of the gate insulating film GI2 and equal to the film thickness of the gate insulating film GI3. Further, the gate length of the gate electrode GE1 is greater than the gate length of the gate insulating electrode GE2 and smaller than the gate length of the gate electrode GE3. This provides the withstand voltage required for the transistor TR1.

While the embodiments of the present invention contemplated by its inventors have been described in detail, the present invention is not limited to the specific embodiments described above. It is to be understood that various modifications of the present invention may be made without departing from the spirit and scope of the present invention.

What is claimed is:

1. A semiconductor device comprising:
   a plurality of bit lines;
   a plurality of plate lines; and
   a plurality of memory cells that are electrically coupled respectively to one of the bit lines and to one of the plate lines and different from each other in the combination of the bit line and the plate line;
   wherein the memory cells each include:
   a variable resistance element; and
   a transistor having a gate electrode, the source of the transistor being electrically coupled to the bit line, the drain of the transistor being electrically coupled to the plate line through the variable resistance element, and
   wherein the transistor and the variable resistance element are configured such that the transistor breaks down between the drain and the source at a forming voltage of the variable resistance element or breaks down between the drain and the gate at the forming voltage.

2. The semiconductor device according to claim 1,
   wherein the memory cells coupled to a same bit line are coupled to a same word line through the gate electrode of the transistor of the respective memory cells, and include a first memory cell, and
   wherein the transistors and variable resistance elements of the memory cells are configured such that a transistor in a second memory cell coupled to the same plate line as the first memory cell does not break down between the drain and the source when a voltage is applied between the plate line and the bit line of the first memory cell to switch the variable resistance element in the first memory cell from a high-resistance state to a low-resistance state.

3. The semiconductor device according to claim 1,
   wherein the memory cells coupled to a same bit line are coupled to a same word line through the gate electrode of the transistor of the respective memory cells, and include a first memory cell, and
   wherein the transistors and variable resistance elements of the memory cells are configured such that a transistor in a second memory cell coupled to a different plate line and different bit line from the first memory cell does not break down between the drain and the source when a voltage is applied between the plate line and the bit line of the first memory cell to switch the variable resistance element in the first memory cell from the low-resistance state to the high-resistance state.

4. The semiconductor device according to claim 1,
   wherein the memory cells coupled to a same plate line are coupled to a same word line through the gate electrode of the transistor of the respective memory cells, and include a first memory cell, and
   wherein the transistors and variable resistance elements of the memory cells are configured such that a transistor in a second memory cell coupled to a different plate line and different bit line from the first memory cell does not break down between the drain and the source when a voltage is applied between the plate line and the bit line of the first memory cell to switch the variable resistance element in the first memory cell from the high-resistance state to the low-resistance state.

5. The semiconductor device according to claim 1,
   wherein the memory cells coupled to a same plate line are coupled to a same word line through the gate electrode of the transistor of the respective memory cells, and include a first memory cell, and
   wherein the transistors and variable resistance elements of the memory cells are configured such that a transistor in a second memory cell coupled to the same bit line as the first memory cell does not break down between the drain and the source when a voltage is applied between the plate line and the bit line of the first memory cell to switch the variable resistance element in the first memory cell from the low-resistance state to the high-resistance state.

6. The semiconductor device according to claim 1,
   wherein the memory cells coupled to a same plate line are coupled to a same word line through the gate electrode of the transistor of the respective memory cells,
   wherein the bit lines are disposed along a first direction and extend in a second direction intersecting the first direction, and
   wherein a first plate line, a first word line, a second word line, and a second plate line are repeatedly disposed in the order named along the second direction and extended in the first direction.

7. The semiconductor device according to claim 6,
   wherein a first transistor is electrically coupled to the first word line,
   wherein a second transistor is electrically coupled to the second word line, and
   wherein the first transistor and the second transistor line up in the second direction and the source of the first transistor is electrically coupled to the source of the second transistor.

* * * * *